United States Patent
Otsuka et al.

(10) Patent No.: US 11,403,518 B2
(45) Date of Patent: Aug. 2, 2022

(54) NEURAL NETWORK CIRCUIT

(71) Applicant: DENSO CORPORATION, Kariya (JP)

(72) Inventors: Shigeki Otsuka, Kariya (JP); Irina Kataeva, Kariya (JP)

(73) Assignee: DENSO CORPORATION, Kariya (JP)

( * ) Notice: Subject to any disclaimer, the term of this patent is extended or adjusted under 35 U.S.C. 154(b) by 643 days.

(21) Appl. No.: 16/379,355

(22) Filed: Apr. 9, 2019

(65) Prior Publication Data
US 2019/0332927 A1 Oct. 31, 2019

(30) Foreign Application Priority Data

Apr. 25, 2018 (JP) .............................. JP2018-084000
Jul. 6, 2018 (JP) .............................. JP2018-129159

(51) Int. Cl.
G06N 3/063 (2006.01)
H03M 1/46 (2006.01)

(52) U.S. Cl.
CPC ............ G06N 3/063 (2013.01); H03M 1/462 (2013.01)

(58) Field of Classification Search
CPC ............ G06N 3/063; G06G 7/60; G06F 3/05; H03M 1/46; H03M 1/462
See application file for complete search history.

(56) References Cited

U.S. PATENT DOCUMENTS 5,216,746 A 6/1993 Yoshizawa et al.
8,451,150 B2 5/2013 Chou
11,138,500 B1* 10/2021 Mountain ............ G06N 3/0635
2002/0033763 A1 3/2002 Nakao
2008/0143658 A1 6/2008 Ishii et al.
(Continued)

FOREIGN PATENT DOCUMENTS

JP H05-175847 A 7/1993

OTHER PUBLICATIONS

Kataeva, Irina, et al. "Efficient training algorithms for neural networks based on memristive crossbar circuits." 2015 International Joint Conference on Neural Networks (IJCNN). IEEE, 2015. (Year: 2015).*
Bayat, Farnood Merrikh, et al. "Memristor-based perceptron classifier: Increasing complexity and coping with imperfect hardware." 2017 IEEE/ACM International Conference on Computer-Aided Design (ICCAD). IEEE, Nov. 13, 2017: 549-554. (Year: 2017).*
(Continued)

Primary Examiner — Kamran Afshar
Assistant Examiner — Randall K. Baldwin
(74) Attorney, Agent, or Firm — Posz Law Group, PLC

(57) ABSTRACT

A neural network circuit includes: a storage portion that includes memristors; D/A converters; drive amplifiers; I/V conversion amplifiers; A/D converters; and offset correctors. The offset corrector includes a first latch circuit, a second latch circuit, a subtractor that subtracts latch data, and a controller. In performing a bias setting operation, the controller controls a bias application amplifier to output the bias voltage, controls each of the D/A converters to cause the drive amplifier other than the bias application amplifier to output a reference voltage, and also cause the first latch circuit to latch the output data. In performing a normal operation, the controller controls the bias application amplifier to output the reference voltage, controls each of the D/A converters to cause the drive amplifier other than the bias application amplifier to output the signal voltage, and also cause the second latch circuit to latch the output data.

19 Claims, 22 Drawing Sheets

(56) References Cited

U.S. PATENT DOCUMENTS

| | | | | |
|---|---|---|---|---|
| 2011/0182104 A1* | 7/2011 | Kim | ............ | G11C 11/5685 365/148 |
| 2012/0109866 A1* | 5/2012 | Modha | ............ | G06N 3/088 706/28 |
| 2012/0200441 A1 | 8/2012 | Ishii et al. | | |
| 2012/0293483 A1 | 11/2012 | Ishii et al. | | |
| 2013/0132314 A1* | 5/2013 | Snider | ............ | G06N 3/063 706/15 |
| 2015/0187414 A1* | 7/2015 | Perner | ............ | G11C 7/067 257/5 |
| 2016/0093373 A1* | 3/2016 | Siau | ............ | G11C 13/0028 365/148 |
| 2017/0017877 A1* | 1/2017 | Kataeva | ............ | G06N 3/0635 |
| 2017/0017879 A1* | 1/2017 | Kataeva | ............ | G06F 11/079 |
| 2017/0337466 A1* | 11/2017 | Bayat | ............ | G06F 3/0655 |
| 2018/0114569 A1* | 4/2018 | Strachan | ............ | G11C 7/1012 |
| 2018/0165573 A1* | 6/2018 | Hsu | ............ | G06N 3/0454 |
| 2018/0276539 A1* | 9/2018 | Lea | ............ | G06N 3/063 |
| 2018/0364785 A1* | 12/2018 | Hu | ............ | G06F 1/3243 |

OTHER PUBLICATIONS

Zamanidoost, Elham, et al. "Manhattan rule training for memristive crossbar circuit pattern classifiers." 2015 IEEE 9th International Symposium on Intelligent Signal Processing (WISP) Proceedings. IEEE, 2015. (Year: 2015).*

Xiaoxiao Liu et al., "A Heterogeneous Computing System with Memristor-Based Neuromorphic Accelerators", 2014.

F. Merrikh Bayat et al., "Advancing Memristive Analog Neuromorphic Networks: Increasing Complexity, and Coping with Imperfect Hardware Components", 2016.

Yu Wang et al., "Low Power Convolutional Neural Networks on a Chip", 2016.

* cited by examiner

FIG. 18

| MODE | ACTION | DRIVE AMP | TRACK/HOLD | SW1 | SW2 | SW10 | SW11 | SW12 | SW20 | SW21 | SW22 | SW23 |
|---|---|---|---|---|---|---|---|---|---|---|---|---|
| OFFSET CORR | 1 : OFFSET READ | BIAS OF DIFFERENCE AMPLIFIRE | TRACK | ON | OFF | ON | OFF | OFF | ON | ON | ON | ON |
| SIGNAL READ | 2 : READ SIGNAL | REFERENCE VOLTAGE OF COMPARATOR | TRACK | OFF | ON | OFF | ON | OFF | ON | ON | ON | ON |
| | 3 : MEASURE, CALCULATE | REFERENCE VOLTAGE OF COMPARATOR | HOLD | OFF | ON | ON | OFF | OFF | ON | ON | ON | ON |
| DAC OUTPUT | 4 : NEXT NETWORK OPERATION | DAC OUTPUT | TRACK | ON | OFF | OFF | OFF | ON | OFF | OFF | OFF | OFF |

NEURAL NETWORK CIRCUIT

CROSS REFERENCE TO RELATED APPLICATIONS

The present application claims the benefit of priority from Japanese Patent Application No. 2018-84000 filed on Apr. 25, 2018 and Japanese Patent Application No. 2018-129159 filed on Jul. 6, 2018. The entire disclosures of the above applications are incorporated herein by reference.

TECHNICAL FIELD

The present disclosure relates to a neural network circuit including a storage portion that includes memristors, as storage elements, connected in a lattice shape.

BACKGROUND

A neural network circuit includes an element having two terminals as a synapse, the element being nonvolatile and capable of varying a conductance value and being referred to as a memristor.

SUMMARY

The present disclosure provides a neural network circuit capable of reducing power consumption based on application of a bias voltage.

Further, the present disclosure provides a neural network circuit capable of reducing a circuit scale while maintaining calculation accuracy and signal process speed.

"Throughout the present disclosure, including the drawings, abstract, written description, and claims: the abbreviation "D/A" means "digital-to-analog"; the abbreviation "A/D" means "analog-to-digital"; the abbreviation "I/V" means "current-voltage"; and the short-hand expression "D flip flop" means "digital flip flop."

According to one aspect of the present disclosure, a neural network circuit includes: a storage portion that may include memristors connected in a lattice shape; multiple D/A converters; and multiple drive amplifiers; multiple I/V conversion amplifiers; multiple A/D converters. One of the voltage input terminals is a bias terminal. At least one of the drive amplifiers may be a bias application amplifier that may apply the bias voltage having an opposite polarity and a reference voltage.

The offset corrector may include a first latch circuit that may receive output data of the A/D converter, a second latch circuit that may receive the output data of the A/D converter, a subtractor that may subtract latch data, and a controller. In performing a bias setting operation, the controller may control the bias application amplifier to output the bias voltage, control each of the D/A converters to cause the drive amplifier other than the bias application amplifier to output the reference voltage, and also cause the first latch circuit to latch the output data of the A/D converter. In performing a normal operation, the controller may control the bias application amplifier to output the reference voltage, control each of the D/A converters to cause the drive amplifier other than the bias application amplifier to output the signal voltage, and also cause the second latch circuit to latch the output data of the A/D converter. The controller may output a subtraction result of the subtractor as signal data.

Further, according to another aspect of the present disclosure, a neural network circuit includes: at least one of storage portions that may include memristors; multiple D/A converters; multiple drive amplifiers; multiple I/V conversion amplifiers; and multiple calculation units that may include multiple A/D converters.

The A/D converter may have a successive approximation type converter that may include a resistance string type D/A converter as a built-in D/A converter. The built-in D/A converter may switch so as to apply the signal voltage of a calculation result to the multiple drive amplifiers arranged corresponding to the storage portion of the calculation unit in a next layer.

BRIEF DESCRIPTION OF THE DRAWINGS

The above and other objects, features and advantages of the present disclosure will become more apparent from the following detailed description made with reference to the accompanying drawings. In the drawings:

FIG. 18 is a view explaining each of operation modes of the A/D converter;

DETAILED DESCRIPTION

A neural network circuit includes an element having two terminals as a synapse, the element being nonvolatile and capable of varying a conductance value and being referred to as a memristor. A research for a configuration of the memristor has been advanced.

The inventors of the present disclosure find out the following.

Figure 14:
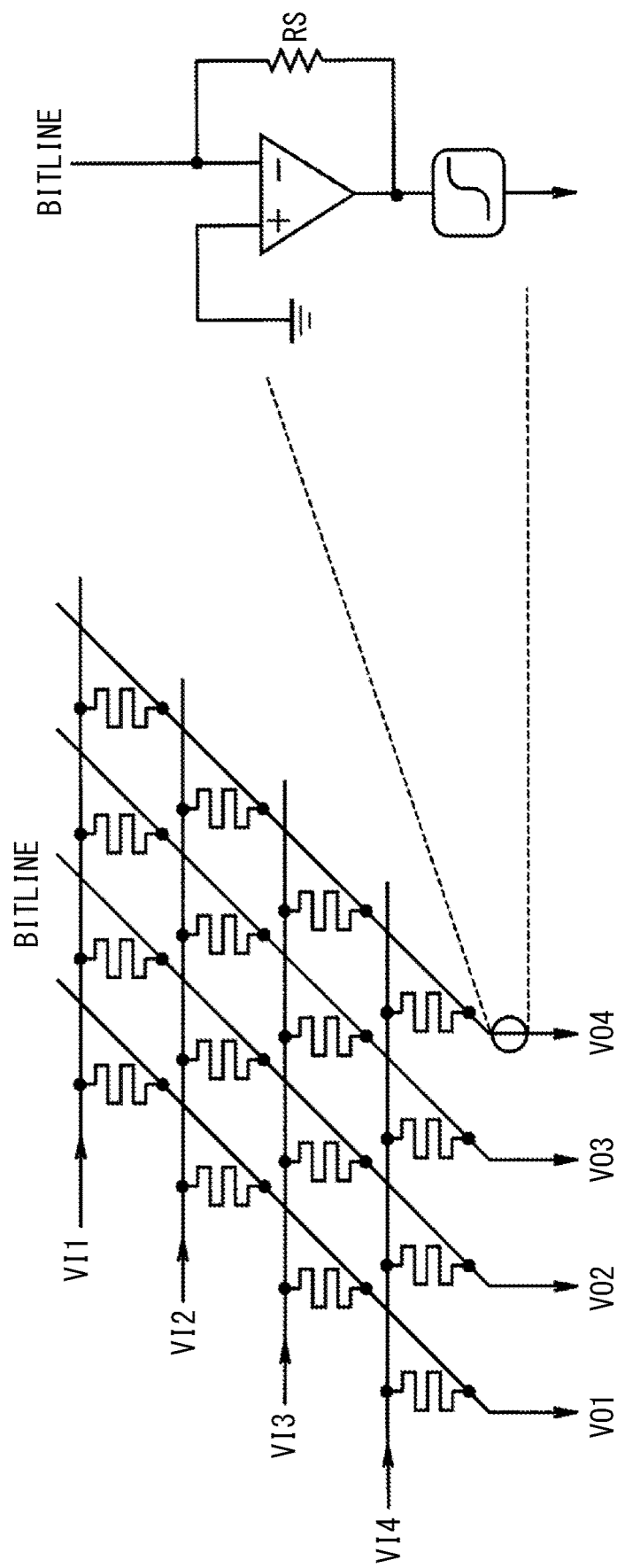
FIG. 14 is a diagram showing a circuit.
Figure 15:
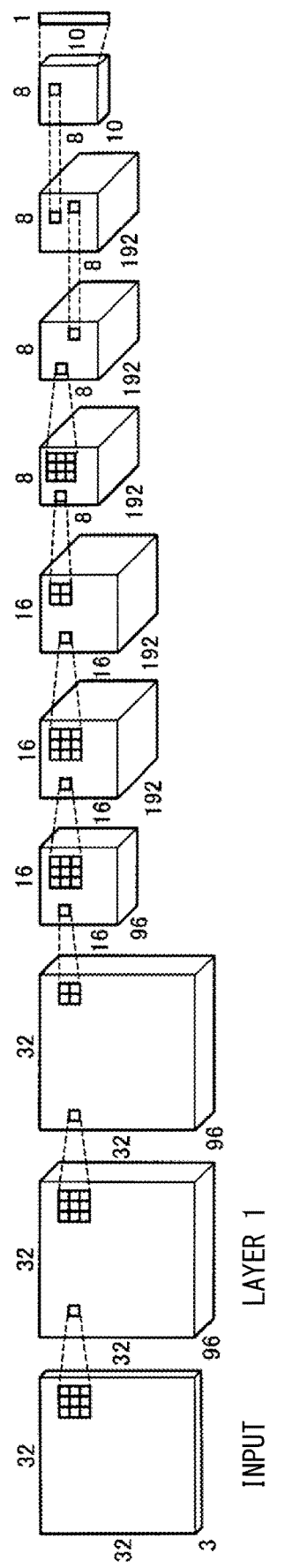
FIG. 15 is a diagram showing a configuration example of 10 layers of CNN configured by employing the circuit shown in FIG. 14.

In the neural network circuit, the memristors are arranged in the lattice shape, a voltage is applied to the memristors, and a current is generated, for example, as shown in FIG. 14. The composite current is converted into a voltage by an I/V conversion amplifier. After a waveform of the voltage is shaped by an activation function, the voltage is output as a voltage value. The memristor operates as the synapse, and the I/V conversion amplifier operates as a neuron. Thereby, the neural network circuit is configured. The I/V conversion amplifier performs a product-sum calculation to the conductance value of the memristor and the applied voltage by analog computation.

In an actual circuit, when each of inputs Vi1 to Vi3 shown in FIG. 14 has a value of −1 to +1, Vi4=−1 is constantly applied as a bias to a threshold value.

Figure 26:
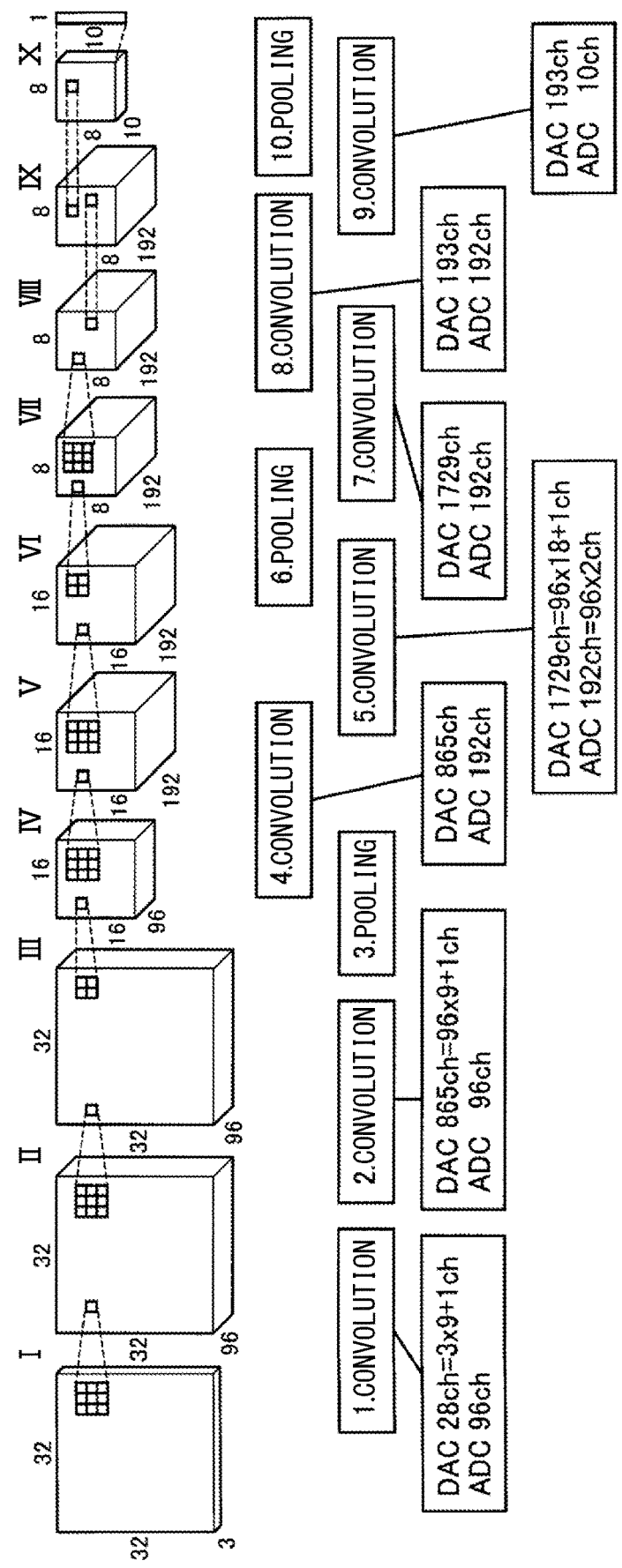
FIG. 26 is a diagram showing a configuration example of 10 layers of CNN.

FIG. 26 shows an example of ten layers of CNN (convolutional neural network). FIG. 26 shows a calculation example of an input current ratio of each input terminal in a first layer when image recognition is performed by the CNN. Input is provided by 28 terminals of Vi1 to Vi28 applied by −Vb to +Vb, and output is provided by 96 terminals of Vo1 to Vo96. Input bias is calculated in a state where Vi28=−Vb is satisfied and Vi28 is constantly applied.

Figure 16:
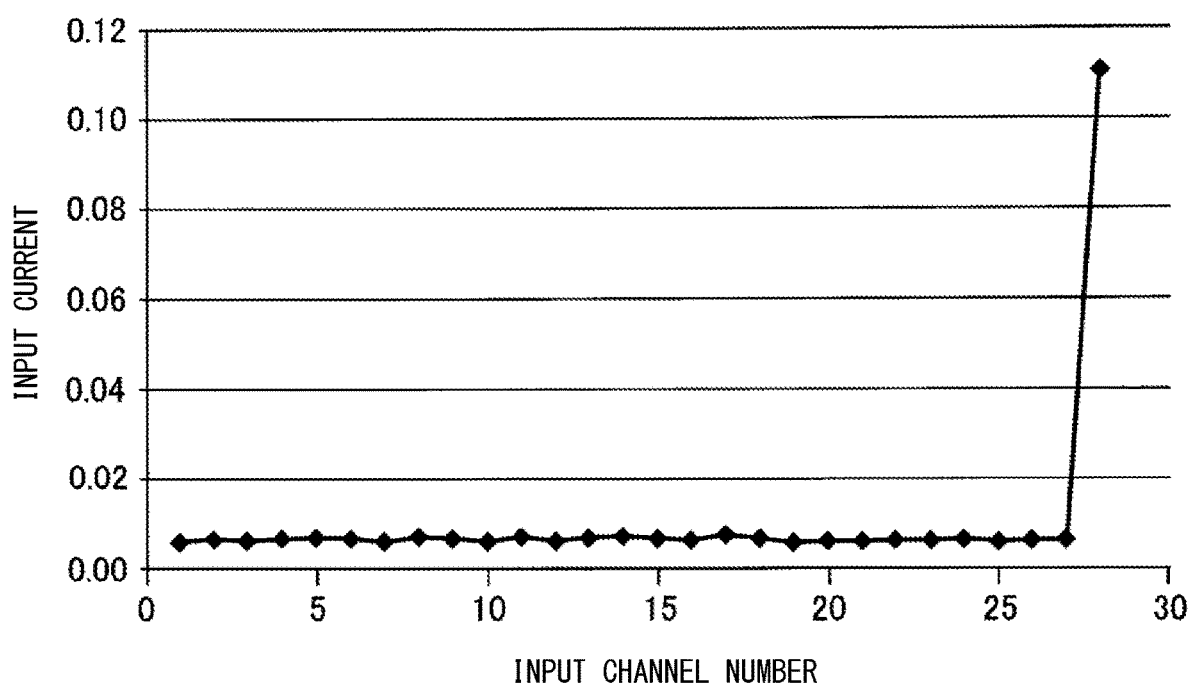
FIG. 16 shows a calculation example of an input current ratio of each input terminal in a first layer when image recognition is performed by the CNN of FIG. 15.

Since the input data has sparsity, a bias current is larger than each of the actual input currents by one digit or more. In an example of FIG. 16, the bias current represents a rate of less than 40% of a sum of the input current.

Hereinafter, embodiments will be described with reference to the drawings.

First Embodiment

Figure 2:
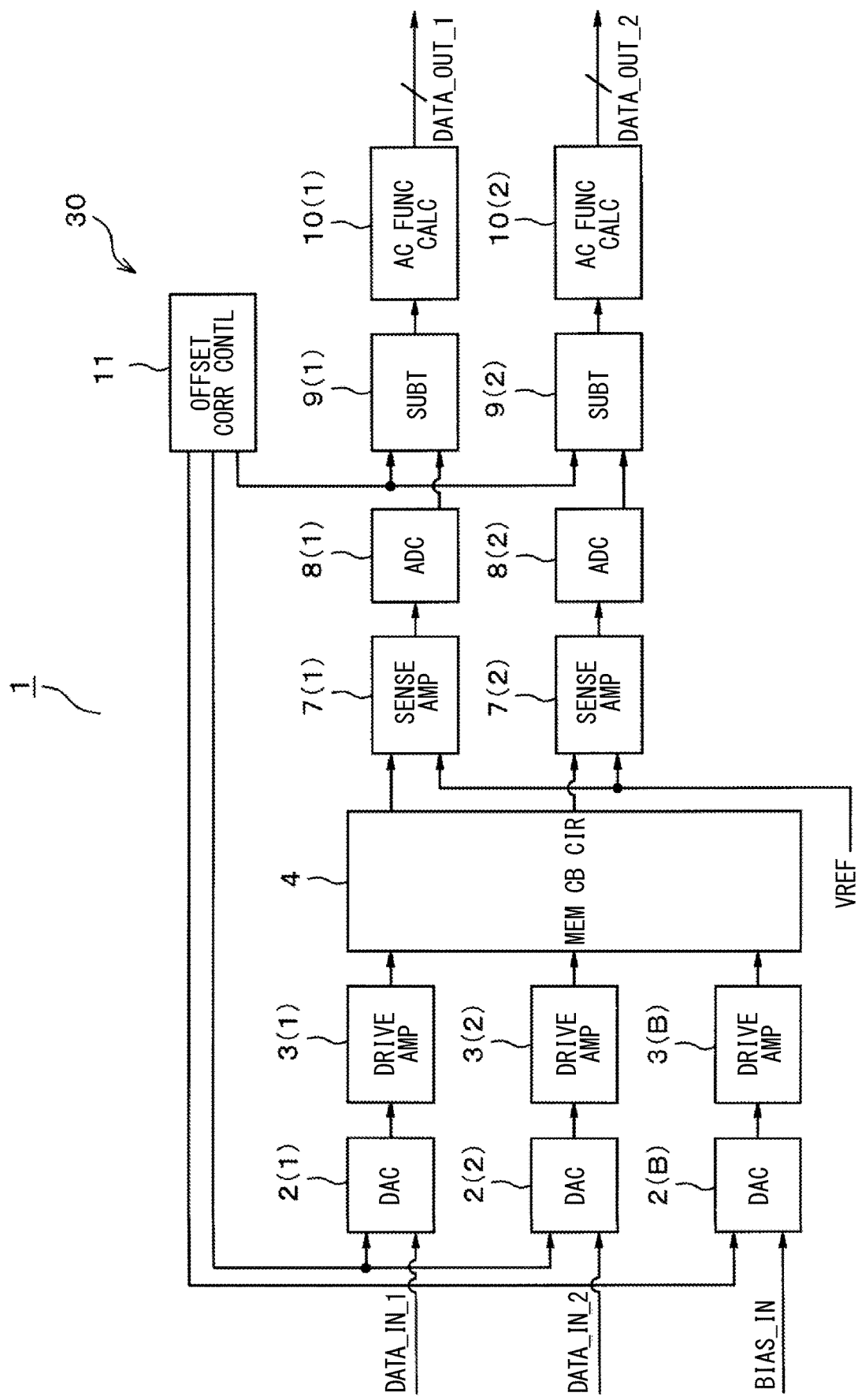
FIG. 2 is a functional block diagram showing an analog product-sum calculation circuit of a neural network circuit.

A first embodiment will be described. An analog product-sum calculation circuit 1 of a neural network circuit shown in FIG. 2 causes a D/A converter 2 to voltage-convert input data Data_in. The converted voltage is applied to a memristor crossbar circuit 4 via a drive amplifier 3. The drive amplifier 3 corresponds to a drive amplifier. The memristor crossbar circuit 4 includes a memristor as a storage element. In a configuration of the memristor crossbar circuit 4, the multiple storage elements are arranged in a lattice shape. The memristor crossbar circuit 4 corresponds to a storage portion.

Figure 5:
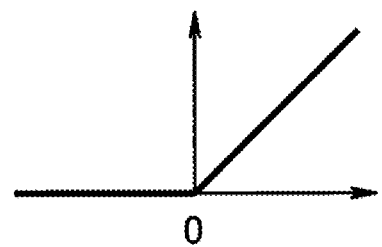
FIG. 5 is a diagram showing one example of an activation function.

The crossbar circuit 4 outputs a current according to a conductance value set in each storage element. The current is converted into a voltage by a sense amplifier 7. The voltage converted by the sense amplifier 7 is A/D-converted by an A/D converter 8 to be output as digital data. The sense amplifier 7 corresponds to an I/V conversion amplifier. The data is input to an activation function calculator 10 via a subtractor 9. In the activation function calculator 10, for example, a ramp function f (x) of the following expression shown in FIG. 5, as an activation function of the neural network circuit, is applied to the input data.

$$f(x) = \max(0, x) \tag{1}$$

This ramp function f (x) has a positive polarity. Outputted data Data_out is input to the analog product-sum calculation circuit 1 of the next stage.

Figure 1:
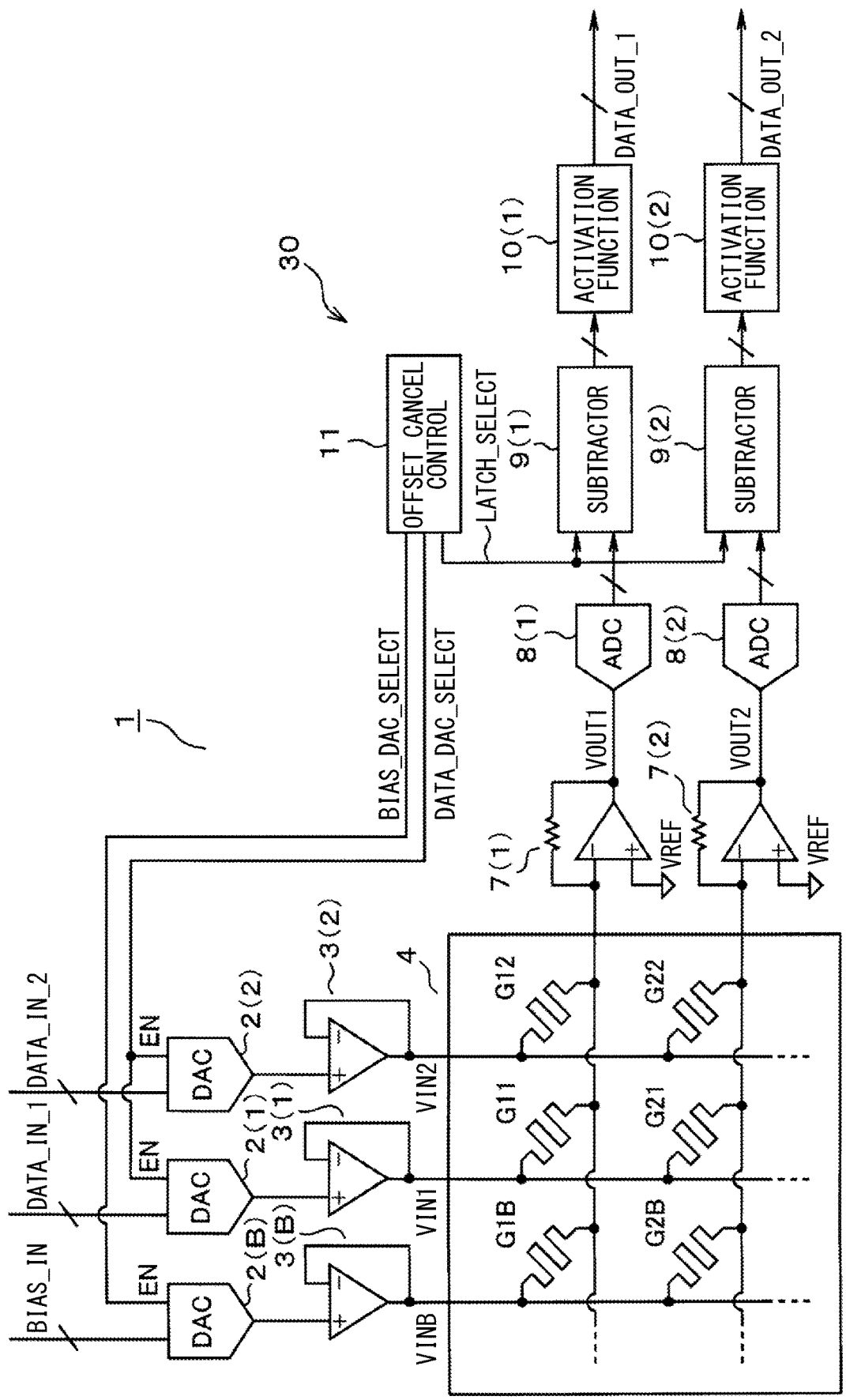
FIG. 1 is a diagram showing a configuration shown in FIG. 2.

An offset correction controller 11 corrects offset included in the output data of the A/D converter 8 by controlling the D/A converter 2 and the subtractor 9. An offset corrector 30 includes the subtractor 9 and the offset correction controller 11. The D/A converters 2, the drive amplifiers 3, the sense amplifiers 7, the A/D converters 8, or the like may be more placed. FIG. 1 shows an input portion and an output portion of the memristor crossbar circuit 4 shown in FIG. 2 in more detail.

Figure 3:
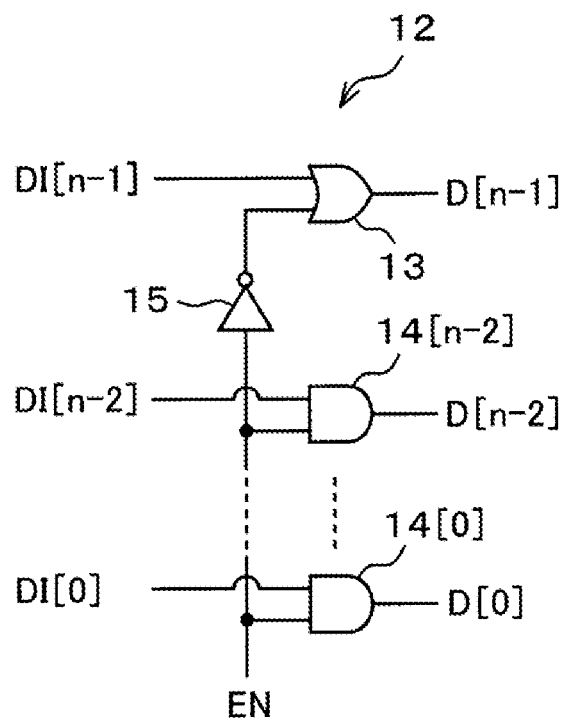
FIG. 3 is a diagram showing a buffer circuit arranged in an input side of a D/A converter.

FIG. 3 shows a buffer circuit 12 in a data input portion of the D/A converter 2. When input data DI is n bits, an OR gate 13 is arranged corresponding to the most significant bit DI[n−1], and AND gates 14[n−2] to 14[0] are arranged corresponding to the other lower bits DI[n−2] to DI[0]. The corresponding input data DI is supplied to one of the input terminals of the logic gates 13 and 14. An enable signal EN output by the offset correction controller 11 is supplied to the other input terminal. The enable signal EN is applied to the OR gate 13 via a NOT gate 15.

When the enable signal EN=0 is satisfied, in the input data of the D/A converter 2, DI[n−1] of the MSB is "1" and all of the DI[n−2] to DI[0] of the other lower bits are "0". As shown in FIG. 1, the enable signal EN input to the D/A converter 2 (B) is a control signal Bias_DAC_select output from the offset correction controller 11. The other D/A converters 2 (1) and 2 (2), or the like are a control signal Data_DAC_select.

For the D/A converters 2 (1) and 2 (2), the conversion voltage is output with respect to the control signal, as following.

| Data_DAC_select | Output voltage |
| --- | --- |
| 0 (initial operation) | Reference voltage Vref |
| 1 (normal operation) | Signal voltage with respect to input data |

For the D/A converter 2(B) Bias_DAC_select, the conversion voltage is output with respect to the control signal, as following.

| Bias_DAC_select | Output voltage |
| --- | --- |
| 0 (normal operation) | Reference voltage Vref |
| 1 (initial operation) | Opposite polarity bias voltage + Vb |

"The initial operation" and "the normal operation" will be described later.

Figure 4:
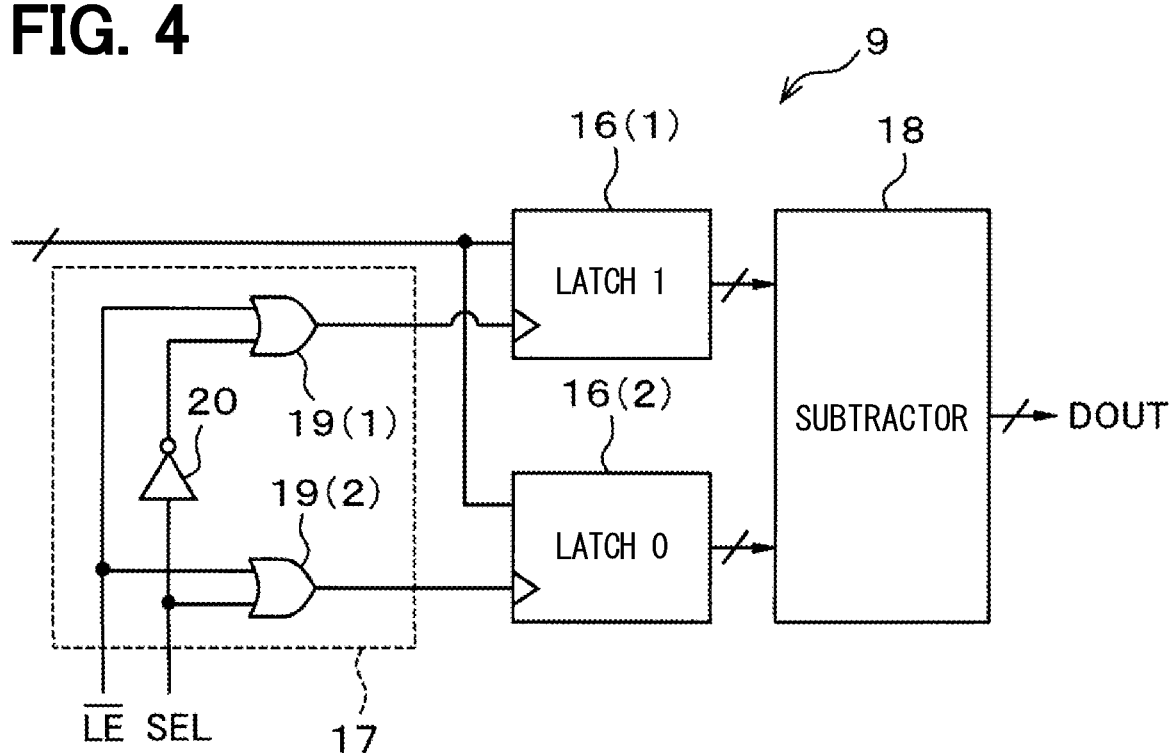
FIG. 4 is a functional block diagram showing an internal configuration of a subtractor.

As shown in FIG. 4, the subtractor 9 includes a first latch circuit 16 (1), a second latch circuit 16 (2), a latch control circuit 17, and a subtractor 18. The input data DI is input to the latch circuit 16, and the latch control circuit 17 inputs a latch signal. The latch control circuit 17 includes OR gates 19 (1) and 19 (2) and a NOT gate 20. A latch signal; LE is input to one of the input terminals of the OR gates 19 (1) and 19 (2), and a select signal Latch_select; SEL is input to the other input terminal. The select signal SEL is input to the OR gate 19 (1) via the NOT gate 20.

Figure 6:
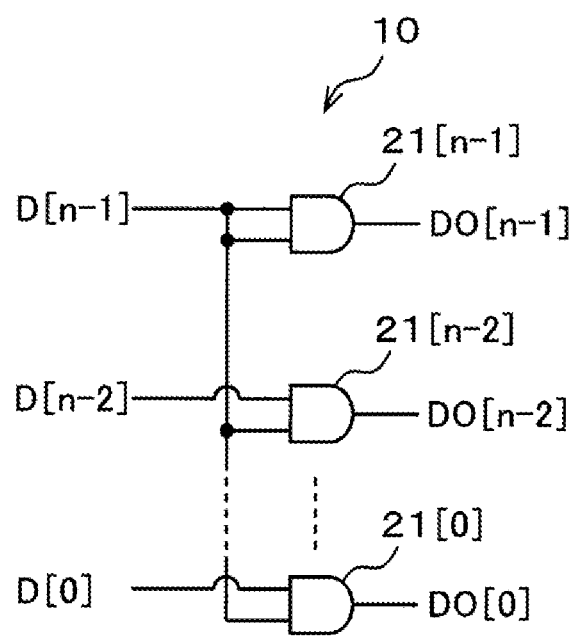
FIG. 6 is a diagram showing a configuration of an activation function calculator.

As shown in FIG. 6, the activation function calculator 10 includes n AND gates 21[n−1] to 21[0]. The data D[n−1] to D[0] output from the subtractor 9 is supplied to one of the input terminals of the AND gates 21, and the data D[n−1] is commonly supplied to the other of the input terminals.

Figure 7:
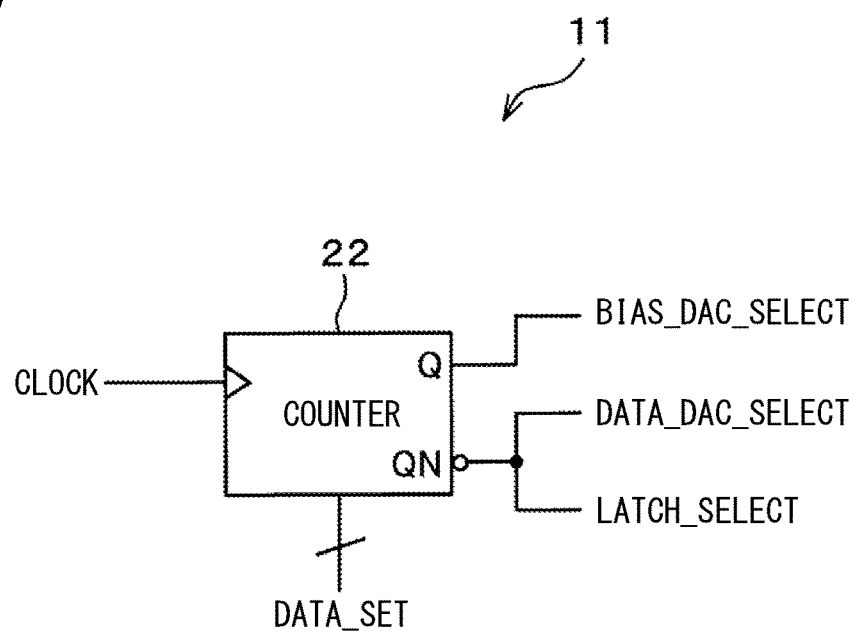
FIG. 7 is a functional block diagram showing a configuration of an offset correction controller.

As shown in FIG. 7, the offset correction controller 11 includes a counter 22. A clock signal Clock is input to the input terminal of the counter 22. A set value data Data_set of a count value is input to the counter 22. The counter 22 counts a count value to set an output signal Q to a high level for one clock period. The counter 22 sets an inversion signal QN of the output signal Q to a low level for one clock period. Incidentally, a high level of the present disclosure may mean a predetermined high state, and a low level may mean a predetermined low state.

The output terminal QN of the counter 22 outputs the control signal Data_DAC_select and a control signal Latch_select. The output terminal Q of the counter 22 outputs the control signal Bias_DAC_select.

Figure 8:
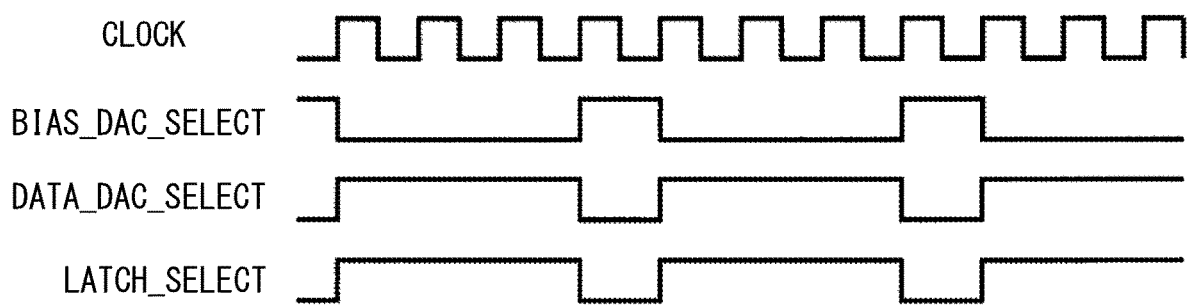
FIG. 8 is a timing chart showing operation of the offset correction controller.

FIG. 8 is a timing chart showing operation of the offset correction controller 11. The offset correction controller 11 sets an execution frequency of an initial state by the count value of the counter 22. In the initial state, the offset voltage Voff and the bias voltage +Vbias having the opposite polarity are retrieved. This execution frequency is set so as to allow an effect by the offset voltage Voff of the sense amplifier 7 or a temperature drift of a conductance in the memristor, as an error of a calculation result.

This example shows a case where the value of the data Data_set set in the counter 22 is "4". The Bias_DAC_select is set to the high level every four counts of the clock signal Clock. The control signal Data_DAC_select and the Latch_select are the inversion of the control signal Bias_DAC_select.

The D/A converters 2 (1) and 2 (2) are in "the initial operation" every 4 clock cycles, and are in "the normal operation" otherwise. The D/A converter 2 (B) is in "the initial operation" in synchronization with the D/A converters 2 (1) and 2 (2) every 4 clock cycles, and is in "the normal operation" otherwise.

Figure 9:
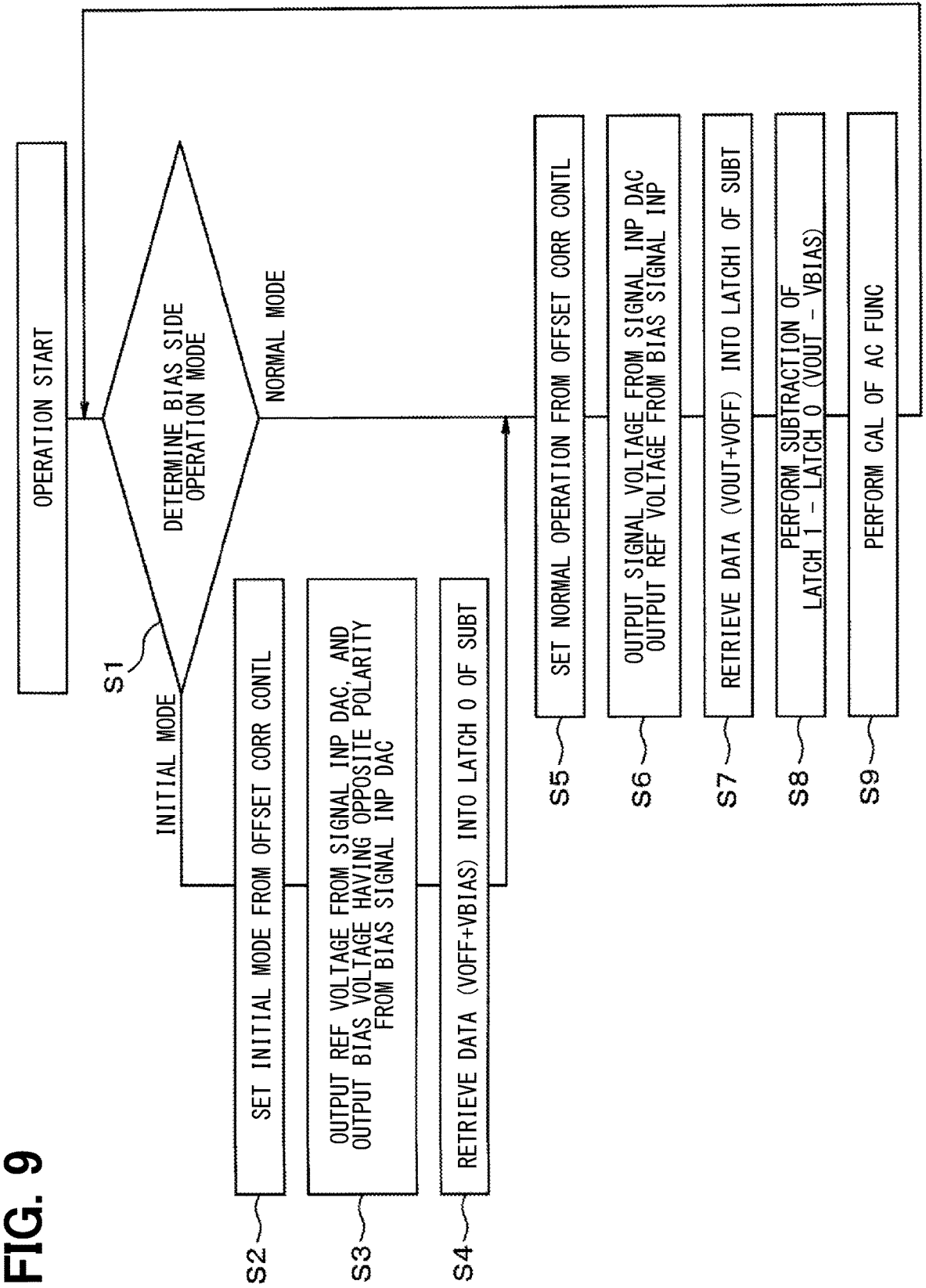
FIG. 9 is a flowchart showing circuit operation of offset correction.

An operation of the embodiment will be described. FIG. 9 shows a circuit operation according to the timing chart of FIG. 8. In step S1, when the bias side operation mode by the offset correction controller 11 is in "the initial operation" (S2), the D/A converters 2 (1) and 2 (2) output the reference voltage Vref and the D/A converter 2 (B) outputs the opposite polarity bias voltage +Vb (S3). "The initial operation" corresponds to the bias setting operation.

It is assumed that a voltage range where the voltage can be applied to both ends of the memristor is included within ±Vb, and the reference voltage Vref applied to the sense amplifier 7 is 0 V, for example. "The initial operation" refers to a state where no potential difference is generated between the both ends of the memristor. The voltages are defined as following:

$$Vin1=Vin2=0\ V, VinB=+Vb.$$

When the offset voltage Voff is generated in the sense amplifier 7, the output voltage Vout is obtained by adding to the offset voltage Voff, the output voltage +Vbias at when the bias voltage +Vb having the opposite polarity is applied. The output voltage Vout is defined as following:

$$Vout=Voff+Vbias.$$

Since Latch_select=0 is satisfied, the latch circuit 16 (2) of the subtractor 9 latches data corresponding to the output voltage (Voff+Vbias) of the sense amplifier 7 (S4).

On the other hand, in step S1, when a bias side operation mode by the offset correction controller 11 is in "the normal operation" (S5), the D/A converters 2 (1) and 2 (2) output signal voltages Vin1 and Vin2 respectively. The D/A converter 2 (B) outputs the reference voltage Vref (S6). The output of the sense amplifier 7 corresponds to the voltage (Vout+Voff) obtained by adding the offset voltage Voff to the output voltage Vout according to the signal voltage Vin. Since Latch_select=1 is satisfied, the latch circuit 16 (1) latches data corresponding to the output voltage (Vout+Voff) of the sense amplifier 7 (S7).

The subtractor 9 of the subtractor 18 subtracts the data of the latch circuits 16 (2) and 16 (1) (S8). The subtraction result may be described as following:

$$(Vout+Voff)-(Voff+Vbias)=Vout-Vbias.$$

Thereby, the obtained data corresponds to a voltage obtained by adding to the output voltage Vout of the sense amplifier 7, the output voltage −Vbias at when the bias voltage −Vbias having the positive polarity is applied. The offset voltage Voff is canceled. After step S8, a calculation of the activation function is executed at step S9.

In the configuration, the signal voltage Vin and the reference voltage Vref are applied to the multiple voltage input terminals of the crossbar circuit 4 including the memristor as the storage element, via the D/A converter 2 and the drive amplifier 3. The current flowing in the current output terminal of the memristor crossbar circuit 4 is converted into the voltage by the sense amplifier 7. The A/D converter 8 A/D-converts the voltage (in other words, the A/D converter 8 performs A/D conversion). The offset corrector 30 is arranged in the output side of the A/D converter 8, and corrects the offset voltage Voff generated in the sense amplifier 7.

The drive amplifier 3 (B) connected with the bias terminal of the memristor crossbar circuit 4 applies the bias voltage +Vb having the opposite polarity and the reference voltage Vref, according to the voltage input from the D/A converter 2 (B).

In the initial operation, the offset correction controller 11 controls each of the D/A converters 2 to output the reference voltage Vref to the drive amplifiers 3 (1) and 3 (2) while causing the drive amplifier 3 (B) to output the bias voltage having the opposite polarity. The offset correction controller 11 causes the first latch circuit 16 (1) to latch the A/D-converted data.

In the normal operation, the offset correction controller 11 controls each of the D/A converters 2 to output the signal voltage Vin to the drive amplifiers 3 (1) and 3 (2) while causing the drive amplifier 3 (B) to output the reference voltage Vref. Then, the offset correction controller 11 causes the second latch circuit 16 (2) to latch the A/D-converted data. The subtractor 18 outputs the subtraction result of the latch data of the second latch circuit 16 (2) and the first latch circuit 16 (1) as signal data DOUT.

In the configuration, the bias current flows in the memristor crossbar circuit 4 only in the initial operation. Therefore, it may be possible to shorten an energization term of the bias current and reduce the current consumption. It may be possible to perform correction of the offset voltage Voff while shortening the energization term. The energization term of the bias current is further shortened since the offset correction controller 11 intermittently performs the initial operation.

Specifically, the offset correction controller 11 performs the initial operation every time at which the clock count value of the clock signal by the counter 22 reaches a predetermined value "4". When the count value reaches the predetermined value, the counter 22 changes the output signal Q to the high level for one clock period. The offset correction controller 11 controls the D/A converter 2 (B) by outputting the control signal Bias_DAC_select from the output terminal Q of the counter 22. The offset correction controller 11 controls the D/A converters 2 (1) and 2 (2) by outputting the control signal Data_DAC_select from the output terminal QN of the counter 22. The offset correction controller 11 controls the latch timing of the latch circuits 16 (1) and 16 (2) by outputting the control signal Latch_select from the output terminal QN of the counter 22. Thereby, it may be possible to set the energization term of the bias current to one clock period every four clock periods.

The D/A converter 2 includes the buffer circuit 12 having the control terminal controlling an input data value. The buffer circuit 12 inputs the data to the corresponding drive amplifier 3 in order to output the reference voltage Vref, with respect to a binary level change of the enable signal EN supplied to the control terminal. Thereby, it may be possible to easily switch between the initial operation and the normal operation.

Second Embodiment

Figure 10:
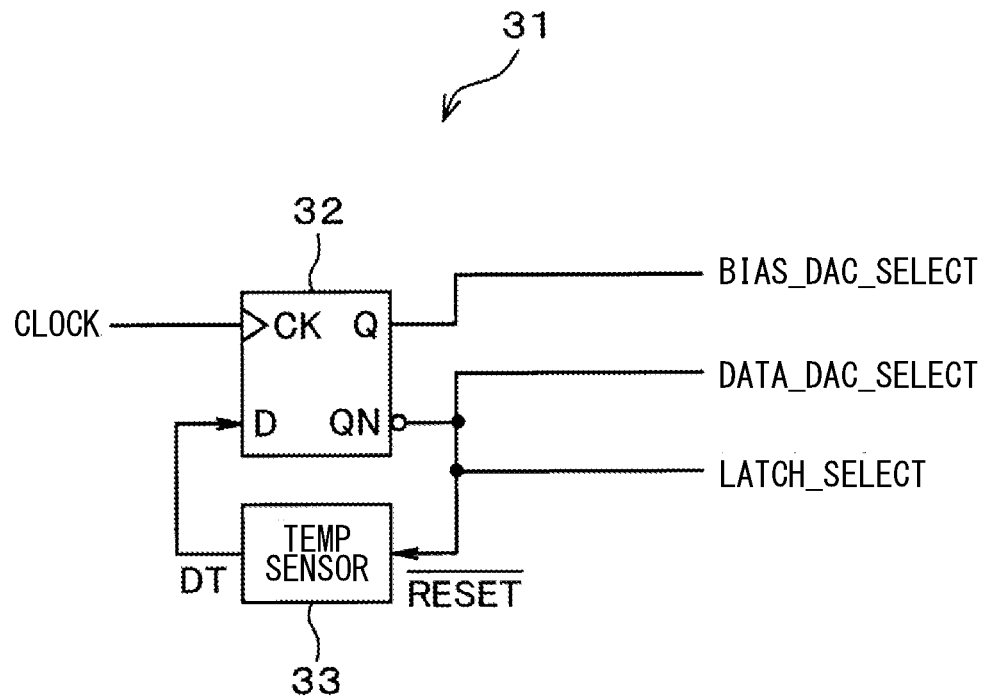
FIG. 10 is a functional block diagram showing a configuration of an offset correction controller according to a second embodiment.

Hereinafter, a second embodiment of the present disclosure will be described. In the second embodiment, similar or corresponding parts as the first embodiment will be designated by the same reference numerals or symbols, and explanations thereof are omitted. Differences from the first embodiment will be described. The second embodiment employs an offset correction controller 31 shown in FIG. 10 instead of the offset correction controller 11. The offset correction controller 31 includes a temperature sensor 33 and a D flip flop 32, instead of the counter 22.

The temperature sensor 33 includes a reset terminal and an output terminal for outputting a signal DT. The temperature sensor 33 detects temperature in peripheral of the memristor crossbar circuit 4, for example. The output terminal of the temperature sensor 33 is connected with an input terminal D of the D flip flop 32. The reset terminal is connected with an output terminal QN of the D flip flop 32. An offset corrector 40 includes the offset correction controller 31.

Figure 11:
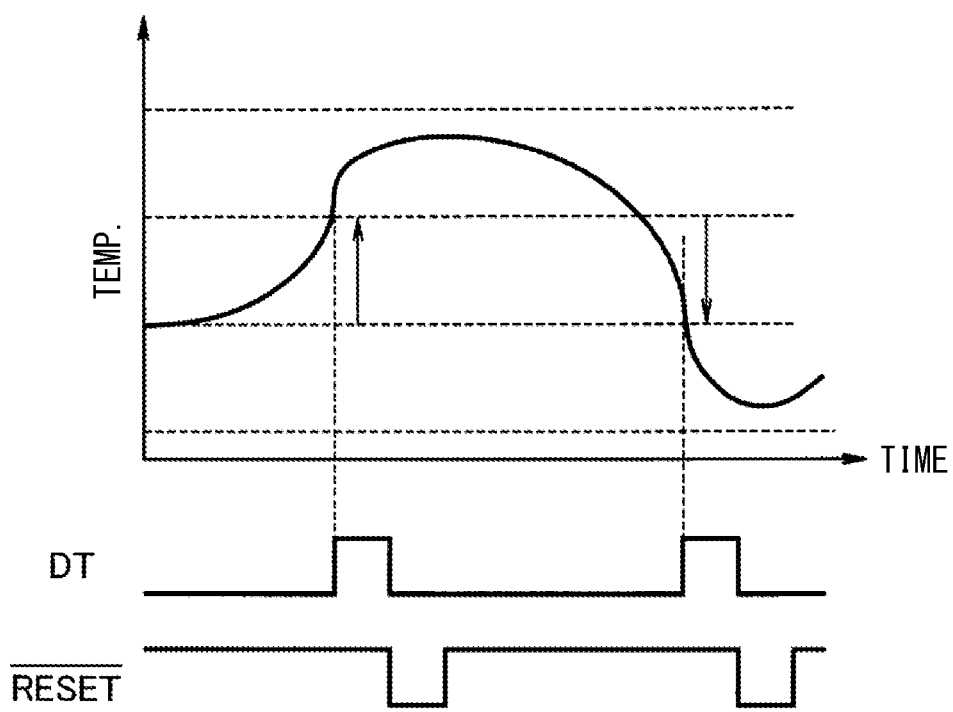
FIG. 11 is a timing chart showing operation of a temperature sensor.

As shown in FIG. 11, the temperature sensor 33 sets the signal DT to a high level when a variation equal to or more than a set value is generated regardless of that a detected temperature rises or downs. The D flip flop 32 synchronizes with the clock signal Clock to retrieve the data value "1", and sets the output terminal Q to the high level. Thereby, the initial operation in the bias side is performed. When the output terminal Q is set to the high level, the output terminal QN is set to the low level. The temperature sensor 33 is reset. Since the signal DT is changed to the low level, the output terminal QN is set to the high level in the next Clock. The reset of the temperature sensor 33 is released.

In the second embodiment, the offset correction controller 31 performs the initial setting operation in the bias side when the variation level of the temperature detected by the temperature sensor 33 exceeds a predetermined level. Specifically, the temperature sensor 33 includes the reset terminal that changes the output signal DT to the high level and changes the output signal DT to the low level when the variation level of the temperature exceeds the predetermined level. For example, the predetermined level may correspond to a predetermined range.

The output terminal of the temperature sensor 33 is connected with the input terminal D of the D flip flop 32. The reset terminal is connected with the output terminal QN. Each of the control signals Bias_DAC_select, Data_DAC_select, and Latch_select is output by the similar configuration of the offset correction controller 11 in the first embodiment. In the configuration, the initial setting operation in the bias side is performed only when the variation level of the temperature exceeds the predetermined level. Therefore, it may be possible to shorten the energization term by energizing the bias current at a necessary timing.

Third Embodiment

Figure 12:
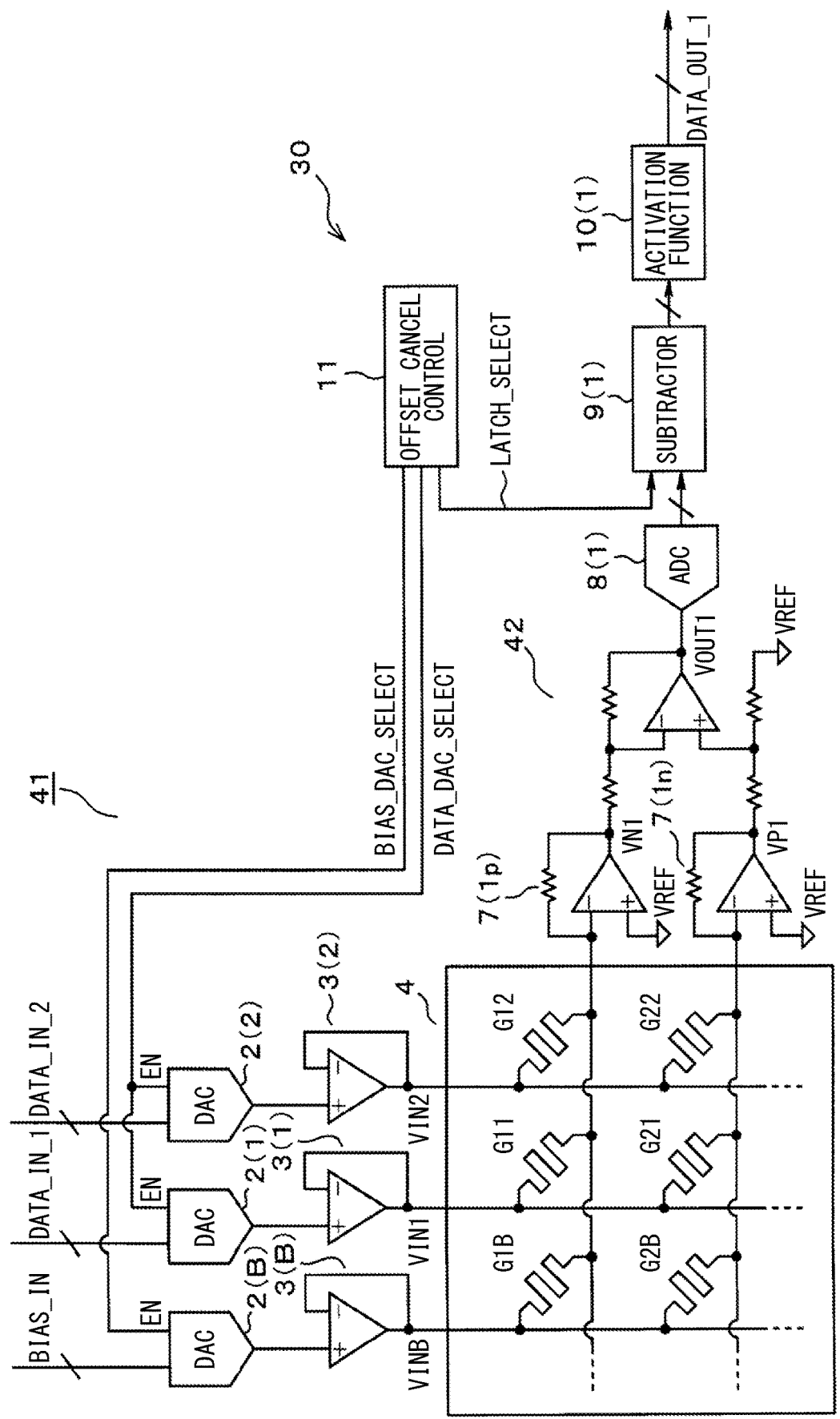
FIG. 12 is a functional block diagram showing an analog product-sum calculation circuit configuring a neural network circuit according to a third embodiment.

In an analog product-sum calculation circuit 41 of the third embodiment shown in FIG. 12, the sense amplifiers 7 (1) and 7 (2) of the first embodiment are respectively described as sense amplifiers 7 (1p) and 7 (1n). The output terminals of the sense amplifiers 7 (1p) and 7 (1n) are connected with each input terminal of a differential amplifier 42. An output terminal of the differential amplifier 42 inputs the output voltage Vout1 to the A/D converter 8 (1). The analog product-sum calculation circuit 41 has a differential configuration.

Operation of the third embodiment will be described. It is assumed that the characteristics of the memristor nonlinearly operate when a reverse direction bias having a large amplitude is applied. In the assumed case, it may be possible to reduce calculation error by setting the input signal voltage and the bias voltage to unipolar voltage inputs in the difference configuration. Similarly to the first embodiment, in the analog product-sum calculation circuit 41, the bias voltage +Vb having the similar opposite polarity to the input signal is applied. The calculation of the offset correction is performed.

Figure 13:
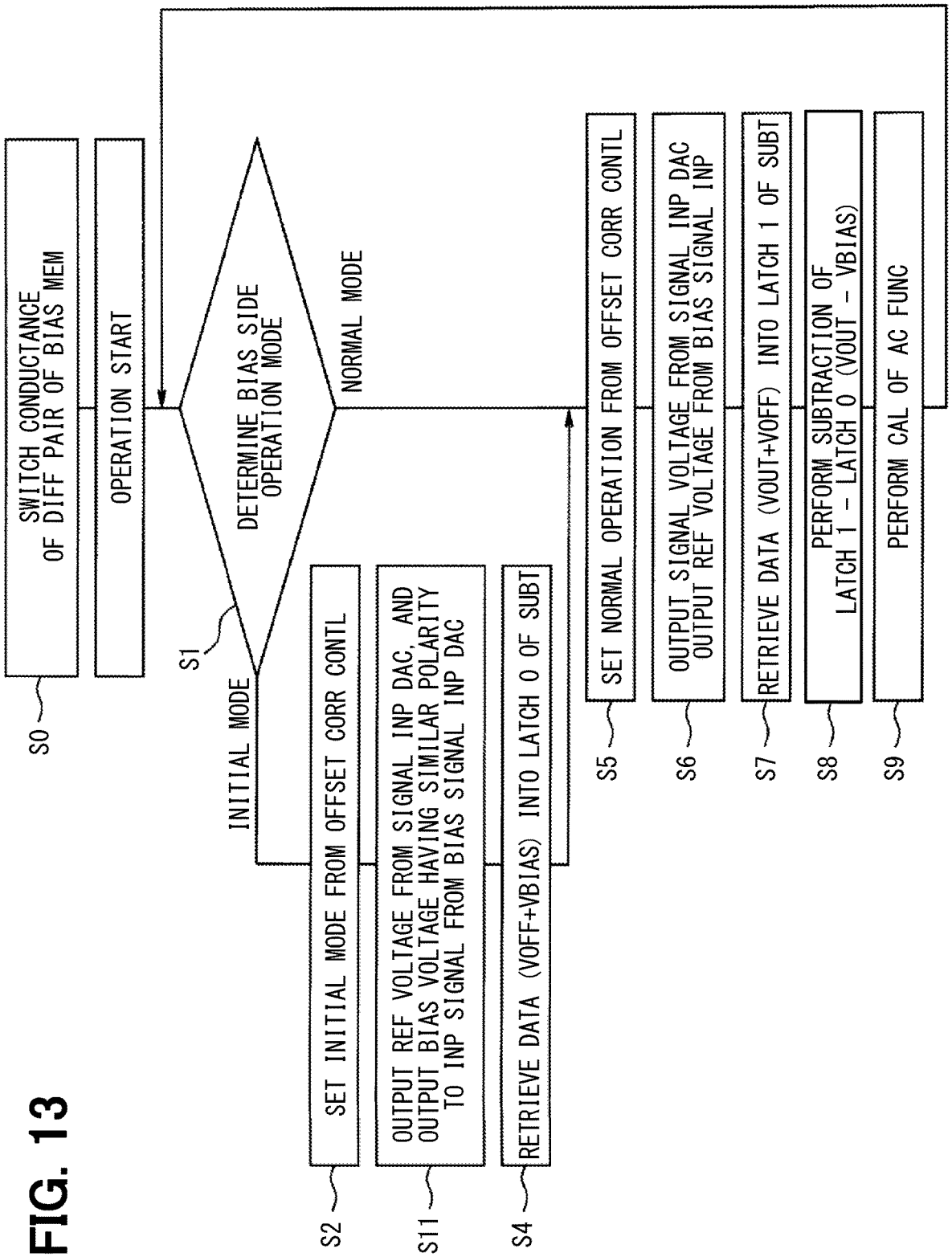
FIG. 13 is a flowchart showing a circuit operation of the offset correction.

The conductance of the memristor is set to G1B≥G2B when the bias voltage is applied in the normal operation. The third embodiment employs a difference output. Therefore, it may be possible to reverse the polarity of the output voltage when the conductance is changed to G1B≤G2B in advance (S0). As shown in FIG. 13, in step S11 instead of step S3, the bias voltage +Vb having the similar polarity to the input signal is output to the D/A converter 2. The calculation is performed similarly to the first embodiment.

In the third embodiment, it may be possible to address the offset of the sense amplifier 7 or the temperature variation of the conductance of the memristor while reducing the energization term of the bias current, similarly to the first embodiment.

Fourth Embodiment

The data value set in the counter 22 may be not limited to "4". The activation function may be a function other than the ramp function.

According to one aspect of the present disclosure, a neural network circuit includes: a storage portion that may include memristors connected in a lattice shape, each of the memristors being a variable resistance element; multiple D/A converters that may receive data to apply a signal voltage and a reference voltage to multiple voltage input terminals of the storage portion; multiple drive amplifiers that may be connected between the multiple D/A converters and the multiple voltage input terminals; multiple I/V conversion amplifiers that may be connected with a current output terminal of the storage portion, and may convert a current flowing in the current output terminal into a voltage to output the voltage as a signal voltage; multiple A/D converters that may A/D-convert the signal voltage converted by the multiple I/V conversion amplifiers; and multiple offset correctors that may be arranged in an output side of the multiple A/D converters and may correct an offset voltage generated in the I/V conversion amplifiers. One of the voltage input terminals is a bias terminal for applying a bias voltage. At least one of the drive amplifiers that may be connected with the bias terminal may be a bias application amplifier that may apply the bias voltage having an opposite polarity and the reference voltage according to a voltage received from the corresponding D/A converter.

The offset corrector may include a first latch circuit that may receive output data of the A/D converter, a second latch circuit that may receive the output data of the A/D converter, a subtractor that may subtract latch data of the first latch circuit from latch data of the second latch circuit, and a controller that may control the D/A converters, the first latch circuit and the second latch circuit. In performing a bias setting operation, the controller may control the bias application amplifier to output the bias voltage having the opposite polarity, control each of the D/A converters to cause the drive amplifier other than the bias application amplifier to output the reference voltage, and also cause the first latch circuit to latch the output data of the A/D converter. In performing a normal operation, the controller may control the bias application amplifier to output the reference voltage, control each of the D/A converters to cause the drive amplifier other than the bias application amplifier to output the signal voltage, and also cause the second latch circuit to latch the output data of the A/D converter. The controller may output a subtraction result of the subtractor as signal data.

For example, when the bias voltage having the opposite polarity may be set to +Vb, data latched in the first latch circuit at a bias setting operation may correspond to a voltage (Voff+Vbias) obtained by adding to an offset voltage Voff generated in the I/V conversion amplifier, a output voltage Vbias at the application of the bias having the opposite polarity. Data latched in the second latch circuit at the normal operation may correspond to a voltage (Vout+Voff) obtained by adding to an output voltage Vout of the amplifier, the offset voltage Voff with respect to the signal voltage Vin that may be input into the I/V conversion amplifier.

The subtraction result by the subtractor may be described as following:

($V$out+$V$off)−($V$off+$V$bias)=$V$out−$V$bias.

The offset voltage may be canceled, and also the subtraction result corresponds to a voltage to which the bias voltage −Vb may be added. It may be possible to shorten a normal term of the bias current and reduce current consumption since the bias current flows in the storage portion only at the bias setting operation. It may be possible to correct the offset voltage while shortening the normal term.

According to another aspect of the present disclosure, similarly, a neural network circuit may have the configurations of the storage portion, the D/A converter, the drive amplifier, and the I/V conversion amplifier. It may be different in a differential configuration. In the differential configuration, a differential amplifier may perform a differential calculation to an output of the two I/V conversion amplifier forming a pair. In the storage portion, the conductance values of a differential pair of the memristors may be changed in advance to reverse the polarity of the bias voltage.

That is, the conductance values of the differential pair of the memristors may be changed in advance to reverse the polarity of the bias voltage, the memristor to which the bias voltage may be added. The operation may correspond to an operation of causing the bias application amplifier to output the bias voltage having the opposite polarity at the bias setting operation. When the output side of the storage portion may have the differential configuration, it may be possible to similarly reduce the current consumption.

In the neural network circuit, it may be possible to further reduce the current consumption since the controller intermittently performs the bias setting operation.

Hereinafter, another configuration of a neural network circuit will be described.

As the neural network, memristors are arranged in the lattice shape, an analog voltage is applied by a D/A converter, and a current is generated, for example, as shown in FIG. 26. The composite current is converted into a voltage by a transimpedance amplifier, and converted into digital data by an A/D converter. After calculation by an activation function, a signal process such as a pooling is performed. An output data is transmitted to the D/A converter in a signal process layer, and the signal process is performed in multiple layers. The product-sum calculation is performed in a crossbar configured from the memristor.

Further, the inventors of the present disclosure find out the following.

FIG. 26 shows an example for a configuration of ten layers of CNN and a convolution neural network for the image recognition, based on the circuit configuration. FIG. 26 shows the necessary channel numbers of an input DAC and an output ADC for each signal process layer. In convolution of the first layer, the convolution layer includes 28 input channels and 96 output channels. In the second layer, the convolution layer includes 865 input channels and 96 output channels. 865 input channels are 96×9+1 channels obtained by adding 1 bias channel to nine data of 96 output channels in the first layer.

It is assumed that a combination of a crossbar of 96 input channels/96 output channels and a crossbar of 1 input channel/96 output channels is employed as a basic configuration in the second layer. A product-sum calculation of 96 input channels/96 output channels is performed nine times and the product-sum calculation of 1 input channel/96 output channels is performed one time. The same calculation result with the crossbar of 865 input channels/96 output channels is provided. It may be possible to match the number of the output DAC with the number of the input ADC except for one bias DAC. However, when providing the configuration as IC, it may be necessary to further reduce the DAC and the ADC in a standpoint of power consumption and area.

Fifth Embodiment

Figure 20:
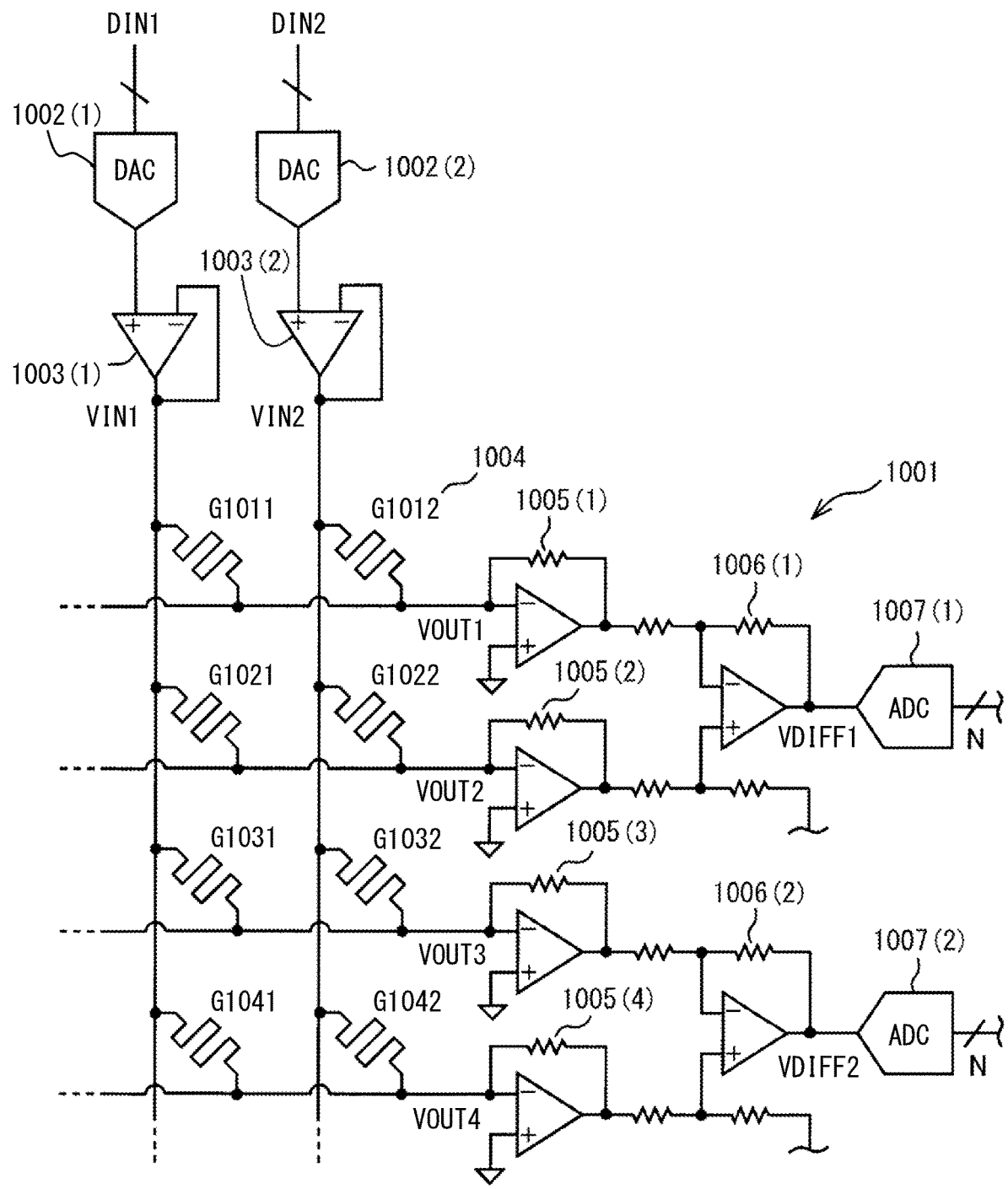
FIG. 20 is a diagram showing a configuration of a crossbar circuit.

A fifth embodiment will be described. FIG. 20 shows an analog product-sum calculation circuit 1001 of a neural network circuit. The analog product-sum calculation circuit 1001 causes a D/A converter 1002 to voltage-convert input data Data_in. The converted voltage is applied to a memristor crossbar circuit 1004 via a drive amplifier 1003. The memristor crossbar circuit 1004 includes memristors $G_{1011}$ to $G_{1042}$ as a storage element. In a configuration of the memristor crossbar circuit 1004, the multiple storage elements are arranged in a lattice shape. The memristor crossbar circuit 1004 corresponds to a storage portion.

The crossbar circuit 1004 outputs the current with respect to a conductance value set in each of the storage elements. The current is converted into a voltage by a sense amplifier 1005. The sense amplifier 1005 corresponds to an I/V conversion amplifier. In the embodiment, the analog product-sum calculation circuit 1001 has a differential configuration. Each of output terminals of the sense amplifiers 1005 (1) and 1005 (2) is connected with each of input terminals of differential amplifiers 1006 (1). An A/D converter 1007 (1) A/D-converts an output voltage of the differential amplifier 1006 (1) to output as digital data. The A/D converter may be referred to as an ADC, and the D/A converter may be referred to as a DAC.

Figure 21:
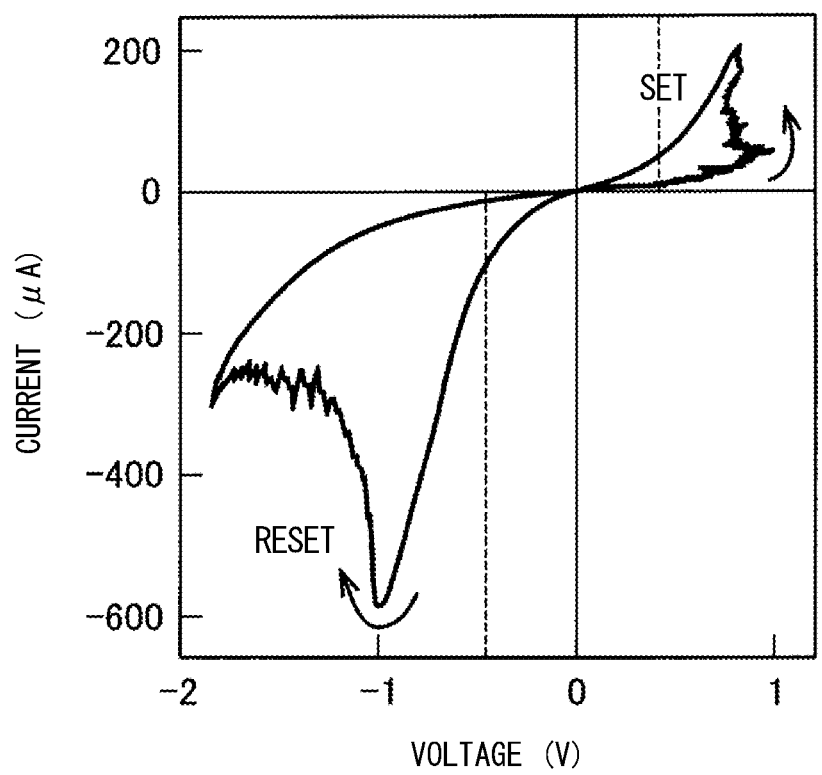
FIG. 21 is a diagram corresponding to FIG. 1(d) of a related art.

FIG. 21 is a diagram corresponding to the drawing of a related art ("Advancing Memristive Analog Neuromorphic Networks: Increasing Complexity, and Coping with Imperfect Hardware Components" arXiv: 1611.04465). As shown in I-V curve of the memristor, an accuracy of a resistance value is provided when a polarity of an applied readout voltage is always applied in a similar direction. Therefore, it may be necessary to express the polarity by using a difference between the conductance of the two memristors. A calculation example of the output voltage $V_{\mathit{diff1}}$ of the differential amplifier 1006 (1) may be described as following:

$$V_{\mathit{diff1}}=k\{V_{in1}(G_{1011}-G_{1021})+V_{in2}(G_{1012}-G_{1022})\}.$$

The value k is a gain.

The output polarity can be reversed with respect to inputs of the similar polarity, based on a magnitude relation of the conductance between pairs $G_{1011}$ and $G_{1021}$ of the memristors and a magnitude relation of the conductance between pairs $G_{1012}$ and $G_{1022}$ of the memristors. However, in the difference configuration, the number of the amplifiers increases. In the neural network circuit, the analog product-sum calculation circuit 1001 corresponds to one calculation unit. The multiple CNN calculations are performed by employing multiple calculation units, as shown in FIG. 26. Therefore, difficulties for power consumption and an area of the analog circuit including the DAC and the ADC may occur.

The embodiment employs a configuration as following.

Figure 19:
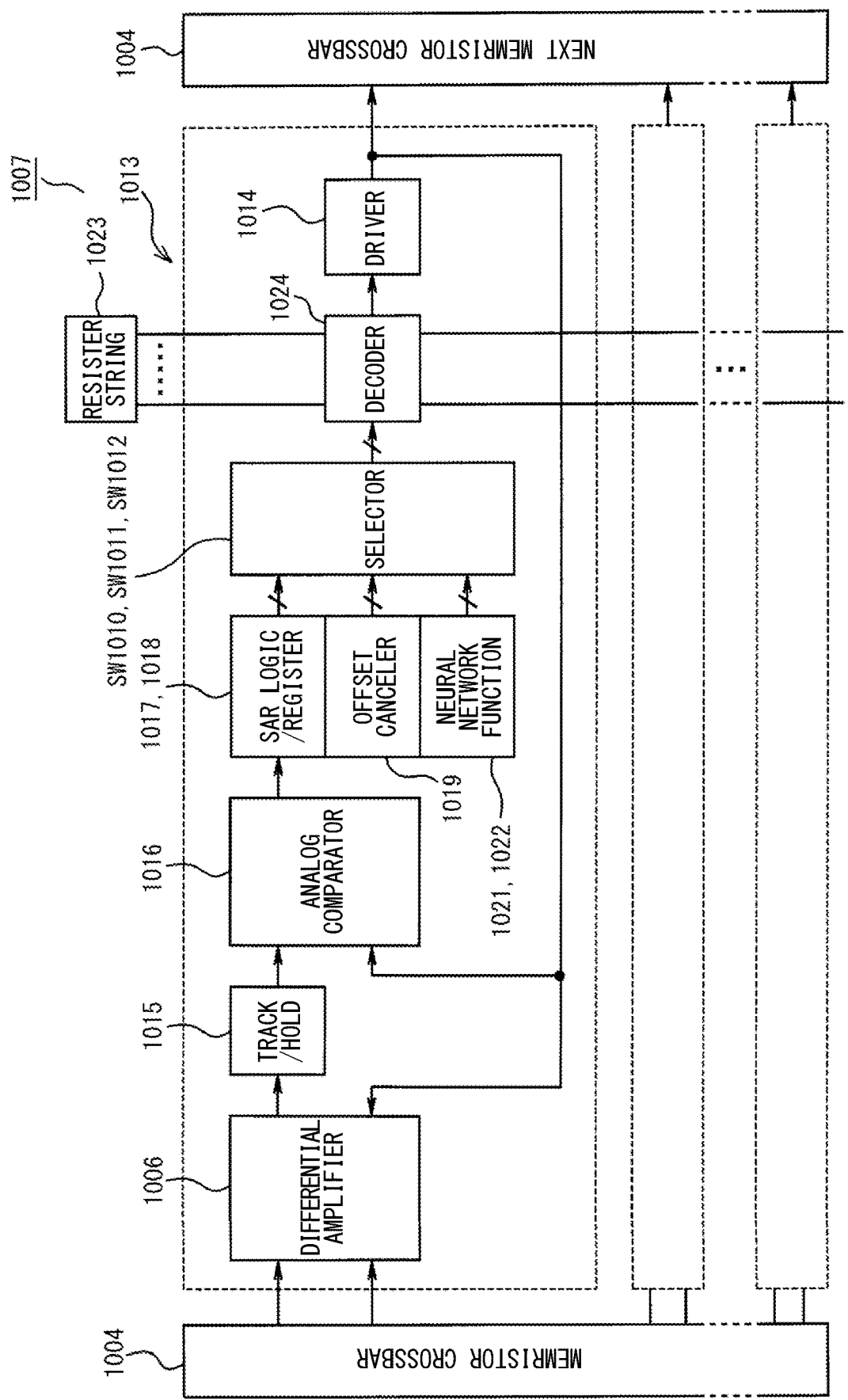
FIG. 19 is a functional block diagram showing a state where multiple analog product-sum calculation circuits are serially connected.

As shown in FIG. 19, the A/D converter 1007 corresponds to a successive approximation type ADC.

The D/A converter built in the successive approximation type ADC is also employed in order to input data to the memristor crossbar circuit 1004 by the analog product-sum calculation circuit 1001 in the next layer.

The built-in D/A converter is employed for the offset correction of the differential amplifier too, and a configuration for the employing the built-in D/A converter is built in the successive approximation type ADC. Details of the configuration will be described.

Figure 17:
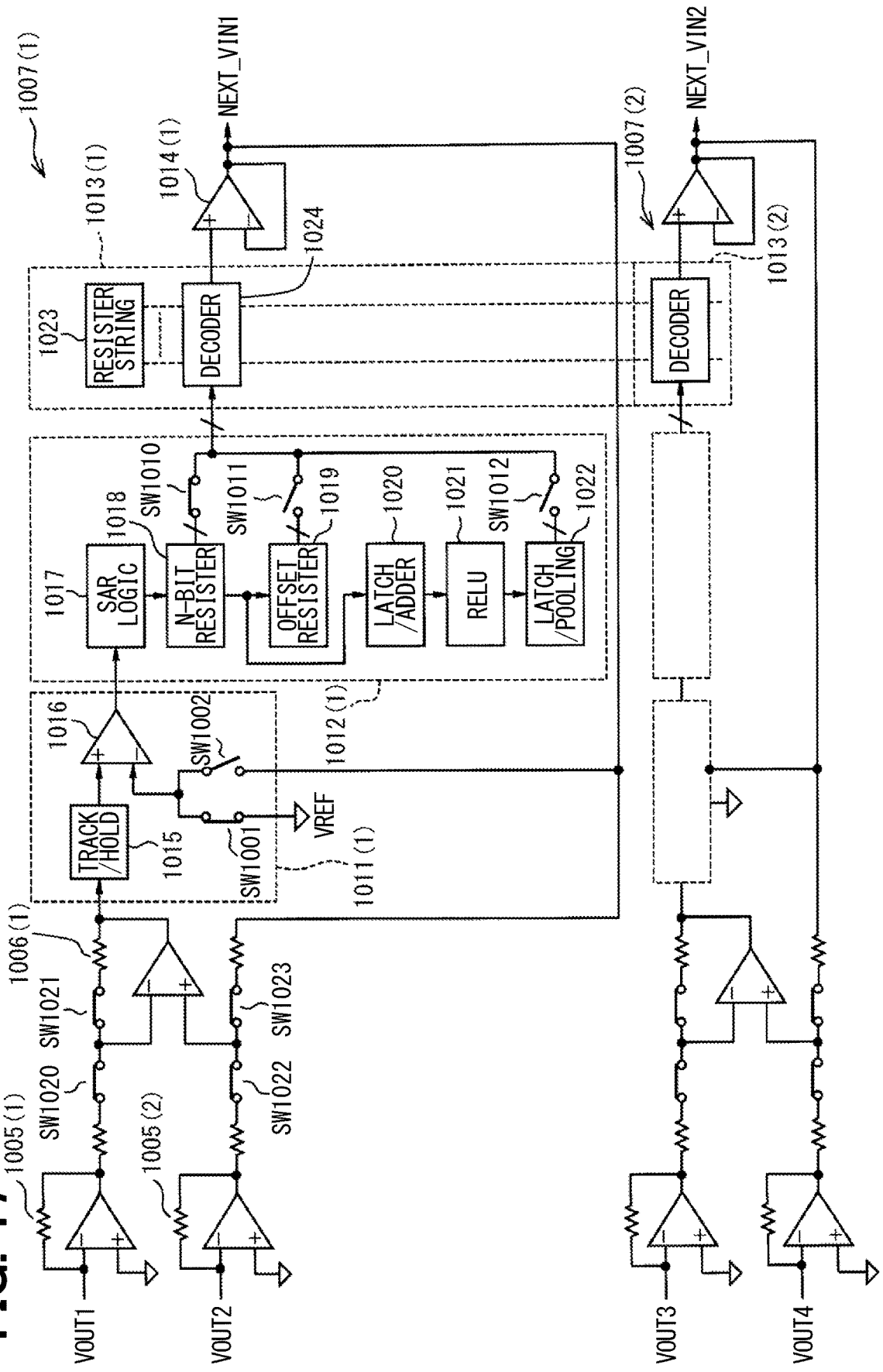
FIG. 17 is a functional block diagram showing an analog product-sum calculation circuit of a neural network circuit according to a fifth embodiment.

As shown in FIG. 17, the successive approximation type A/D converter 1007 includes a comparator 1011, a logic portion 1012, a built-in DAC portion 1013, and a drive amplifier 1014. The comparator 1011 includes a track/hold circuit 1015 and a comparator 1016. An output voltage of the differential amplifier 1006 is input to the track/hold circuit 1015. The track/hold circuit 1015 outputs the output voltage to a non-inversion input terminal of the comparator 1016 unless holding a level of the output voltage at a predetermined timing.

An inversion input terminal of the comparator 1016 receives the reference voltage Vref via the switch SW1001, and is connected with the output terminal of the drive amplifier 1014 via the switch SW1002. The non-inversion input terminal and the inversion input terminal of the differential amplifier 1006 (1) respectively are connected with the output terminals of the sense amplifier 1005 (1) and 1005 (2) via the switches SW1020 and SW1022. The inversion input terminal is connected with the output terminal of the differential amplifier 1006 (1) via the switch SW1021 and a resistance element. The non-inversion input terminal is connected with the output terminal of the drive amplifier 1014 via the switch SW1023 and the resistance element.

The logic portion 1012 includes a SAR logic portion 1017, an N-bit register 1018, an offset register 1019, a latch adder 1020, a ReLU calculator 1021, and a latch/pooling calculator 1022. The SAR logic portion 1017 of the logic portion 1012 performs a control corresponding to the successive approximation type ADC. The N-bit register 1018 stores N-bit data of a result obtained by A/D conversion by the SAR logic portion 1017. The offset register 1019 stores the offset voltage data of the differential amplifier 1006, the offset voltage data being A/D-converted by the A/D converter 1007.

The latch adder 1020 latches the data stored in the N-bit register 1018 to perform addition. The ReLU calculator 1021 calculates to the data input from the latch adder 1020. In the calculation, for example, a ramp function f (x) of the following expression is applied as an activation function of the neural network circuit.

$$f(x)=\max(0,x) \qquad (1).$$

The latch/pooling calculator 1022 latches data input from the ReLU calculator 1021 to perform the pooling calculation.

The output terminals of the N-bit register 1018, the offset register 1019, and the latch/pooling calculator 1022 respectively is connected with the input terminals of the built-in DAC portions 1013 via the switches SW1010, SW1011, and SW1012. The built-in DAC portion 1013 includes a resistance string portion 1023 and a decoder 1024. The reference string portion 1023 includes a series resistance circuit, and applies each of the reference voltages for the D/A conversion. The decoder 1024 decodes the data input from the logic portion 1012 and switches so as to appropriately apply the reference voltage generated by the resistor string portion 1023. The voltage of the D/A conversion result output from the decoder 1024 is input to the drive amplifier 1014.

The built-in DAC portion 1013 (2) of the A/D converter 1007 (2) commonly uses the resistance string portion 1023 of the built-in DAC portion 1013 (1). The similar applies to the A/D converter 1007 (3) and after (not shown).

An operation of the embodiment will be described. As shown in FIG. 18, the A/D converter 1007 performs three operation modes including an offset correction mode, a signal reading mode, and a DAC output mode.

<Offset Correction Mode>

In the offset correction mode, the A/D converter 1007 corrects the offset voltage generated in the input side of the differential amplifier 1006. In a state where an output of the crossbar circuit 1004 is no-signal, the switches SW1020 to SW1023 turn on to operate the differential amplifier 1006. The track/hold circuit 1015 is set in a track state, and the output voltage of the differential amplifier 1006 is input to the non-inversion input terminal of the comparator 1016.

The switch SW1001 turns on and the switch SW1002 turns off to input the reference voltage Vref to the inversion input of the comparator 1016. The switch SW1010 turns on, the switch SW1011 and the switch SW1012 turn off to operate the drive amplifier 1014 as a bias buffer of the differential amplifier 1006. The SAR logic portion 1017 provides operation of the successive approximation type ADC, and the offset voltage of the differential amplifier 1006 is A/D-converted. The offset register 1019 stores the converted data.

<Signal Reading Mode>

In the signal reading mode, the A/D converter 1007 performs the operation of the successive approximation type ADC. The switches SW1020 to SW1023 turn on to operate the differential amplifier 1006. The switch SW1001 turns off and the switch SW1002 turns on to input the output voltage of the drive amplifier 1014 to the inversion input terminal of the comparator 1016. The output voltage of the drive amplifier 1014 corresponds to the DAC output. The offset voltage corresponds to the data stored in the offset register 1019. The switch SW1010 turns off, the switch SW1011 turns on and the switch SW1012 turns off to input the offset voltage to the inversion input terminal of the differential amplifier 1006. Thereby, the offset correction is performed.

The track/hold circuit 1015 is set in the track state to read the output voltage of the differential amplifier 1006. After the track/hold circuit 1015 is switched in a hold state, and the switch SW1010 turns on and the switch SW1011 turns off to perform the operation of the successive approximation type ADC. When it is sufficient to perform reading of the crossbar circuit 1004 once, the ReLU calculator 1021 calculates the data and the calculation result is stored.

<DAC Output Mode>

In the DAC output mode, the A/D converter 1007 inputs the calculation result to the analog product-sum calculation circuit 1001 in the next layer. The switches SW1020 to SW1023 turn on to operate the differential amplifier 1006. The switch SW1001 turns on and the switch SW1002 turns off to disconnect the drive amplifier 1014 and the comparator 1016. The switch SW1010 and the switch SW1011 turn off, and the switch SW1012 turns on to write data after the pooling process in the crossbar circuit 1004 of the analog product-sum calculation circuit 1001 in the next layer. In the analog product-sum calculation circuit 1001 of the next layer, the reference voltage is output when the offset correction of the drive amplifier 1003 is performed.

In the embodiment, the neural network circuit includes the multiple calculation units. The calculation unit includes the crossbar circuit 1004. In the crossbar circuit 1004, the memristors are connected in the lattice shape, each of the memristors being a variable resistance element having the bipolar characteristic. Further, the calculation unit includes: multiple D/A converters 1002 that receive the data to apply the signal voltage to the multiple voltage input terminals of the crossbar circuits 1004; the multiple drive amplifier 1003 that receive the output voltage of the D/A converter 1002 to apply the signal voltage to the multiple voltage input terminals; the multiple sense amplifiers 1005 that change the current flowing in the current output terminal of the crossbar circuit 1004 into the voltage to output; and the multiple A/D converters 1007 that A/D-convert the signal voltage converted by the sense amplifier 1005.

The A/D converter 1007 has the successive approximation type having the resistance string type DAC portion 13. The DAC portions 13 can be switched so that the signal voltage of the calculation result by the crossbar circuit 1004 is applied to the multiple drive amplifiers 1003 placed with respect to the crossbar circuits 1004 in the next layer. In the configuration, it may be possible to employ, as the D/A converter, the DAC portion 1013 built in the A/D converter 1007 in the previous layer, in order to input the data to the calculation unit in the next layer. It may be possible to reduce the circuit scale for the configuration.

The neural network circuit includes the differential amplifier 1006 that performs the differential calculation of the output from the two sense amplifiers 1005 forming a pair. The A/D converter 1007 A/D-converts the output voltage of the differential amplifier 1006. The reference voltage Vref can be applied to the differential amplifier 1006 by switching the switches SW1001 and SW1002. In a state where the signal voltage is not applied to the voltage input terminal of the crossbar circuit 1004, the offset voltage output form the differential amplifier 1006 is A/D-converted. The offset register 1019 stores the converted data. In the configuration, it may be possible to perform the offset correction of the differential amplifier 1006 based on the voltage data stored in the offset register 1019.

Sixth Embodiment

Figure 22:
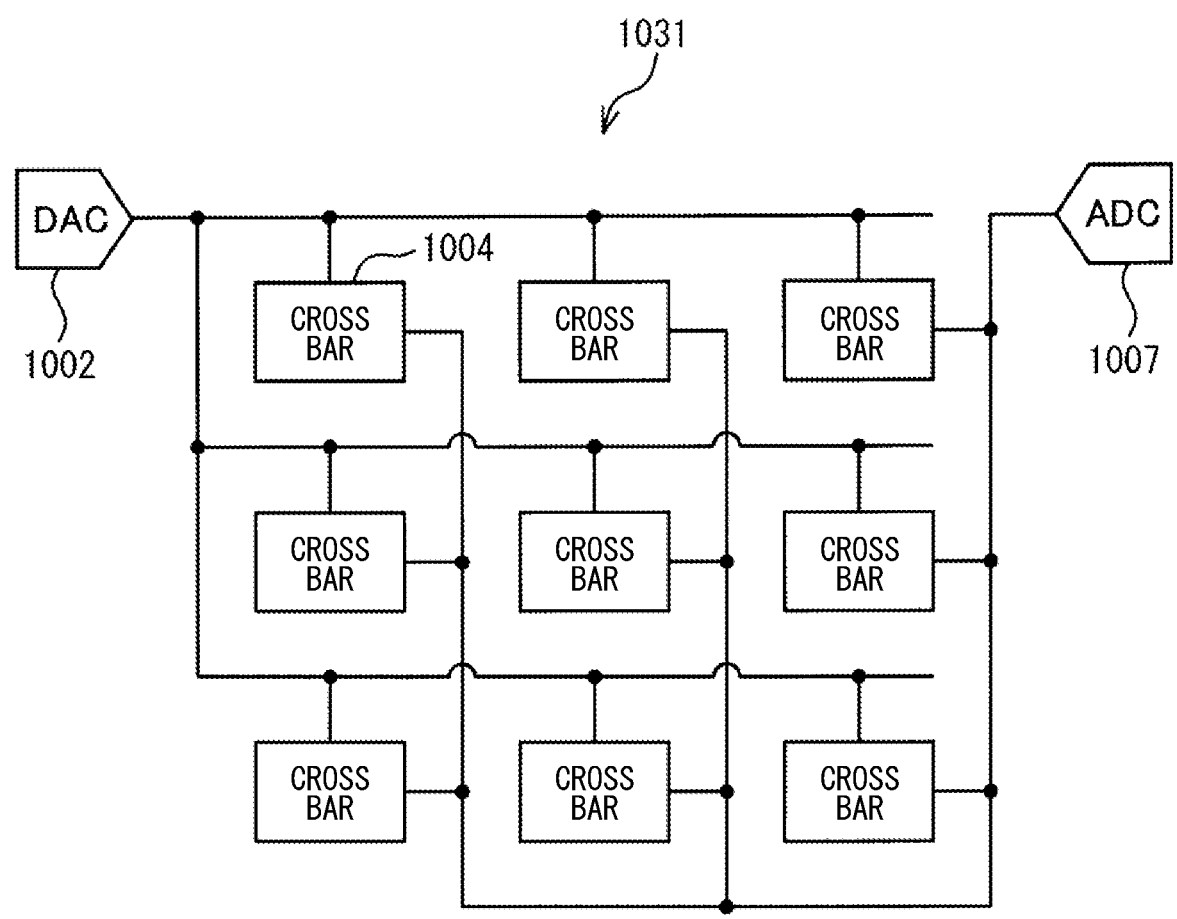
FIG. 22 is a functional block diagram showing an analog product-sum calculation circuit including the multiple crossbars according to a sixth embodiment.

Hereinafter, the similar portions to the fifth embodiment will be designated by the same reference numerals and explanations thereof are omitted. Differences from the fifth embodiment will be described. As schematically shown in FIG. 22, an analog product-sum calculation circuit 1031 of a sixth embodiment includes, for example, nine crossbar circuits 1004 between the common D/A converter 1002 and the common A/D converter 1007. The output terminal of the D/A converter 1002 is connected with the voltage input terminal of all voltage input terminals of the crossbar circuits 1004. The input terminal of the A/D converter 1007 is connected with all of the current output terminals of the crossbar circuits 1004.

The analog product-sum calculation circuit 1031 combines the output results of the multiple crossbar circuits 1004. Then, the analog product-sum calculation circuit 1031 selects one of the multiple crossbar circuits 1004. When the selected crossbar circuit 1004 is in a first stage, the independent D/A converter 1002 inputs the voltage signal. When the selected crossbar circuit 1004 is in the second layer, the built-in DAC portion 1013 of the A/D converter 1007 inputs the voltage signal.

The A/D converter 1007 A/D-converts the output signal corresponding to the calculation result of the crossbar circuit 1004. The converted output signal is stored in the N-bit register 1018. Next, the crossbar circuit 1004 is switched to another, and the signal is similarly input. The latch adder 1020 adds the output data. The above processes are repeated multiple times. After the processes, the ReLU calculator 1021 and the latch/pooling calculator 1022 perform the calculation, the final calculation result is stored.

In the sixth embodiment, the analog product-sum calculation circuit 1031 includes the multiple crossbar circuits 1004. One of the crossbar circuits 1004 is selected. The D/A converter 1002 or the built-in DAC portion 1013 in the input side applies the signal voltage. The A/D converter 1007 A/D-converts the output signal voltage. The latch adder 1020 of the A/D converter 1007 accumulates the calculation results of each crossbar circuit 1004. In the configuration, it may be possible to largely reduce the circuit area even in a case where the neural network circuit performs a large scale calculation by employing the multiple crossbar circuits 1004 of the present disclosure.

Seventh Embodiment

A seventh embodiment shows another configuration for performing the large scale calculation such as the sixth embodiment. In the sixth embodiment, the product-sum calculation result by each of the crossbar circuits 1004 is added in a digital region after A/D conversion. There may be a difficulty that a signal process time is prolonged by this repetitive calculation.

Figure 23:
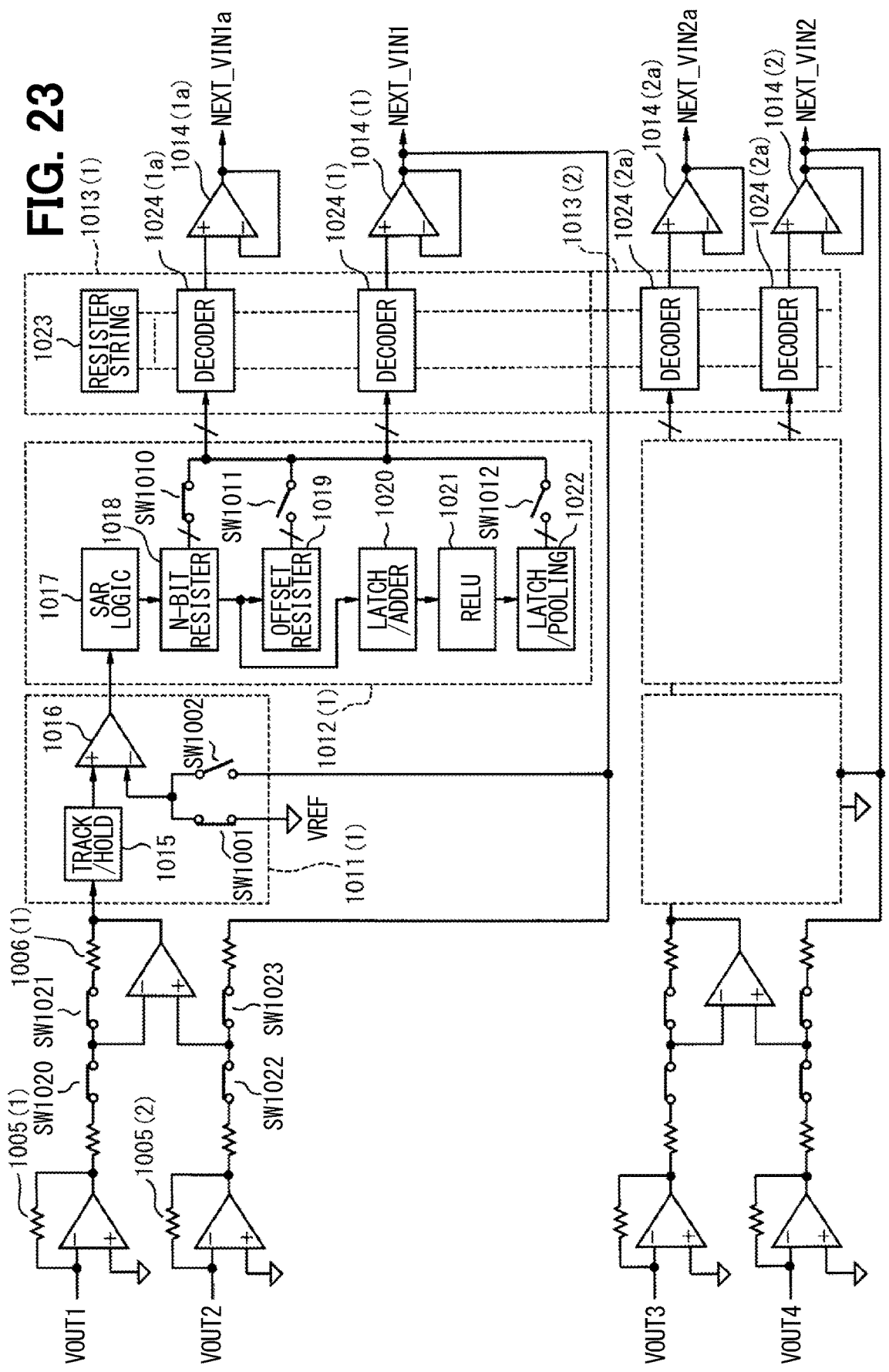
FIG. 23 is a functional block diagram showing an analog product-sum calculation circuit according to a seventh embodiment.
Figure 25:
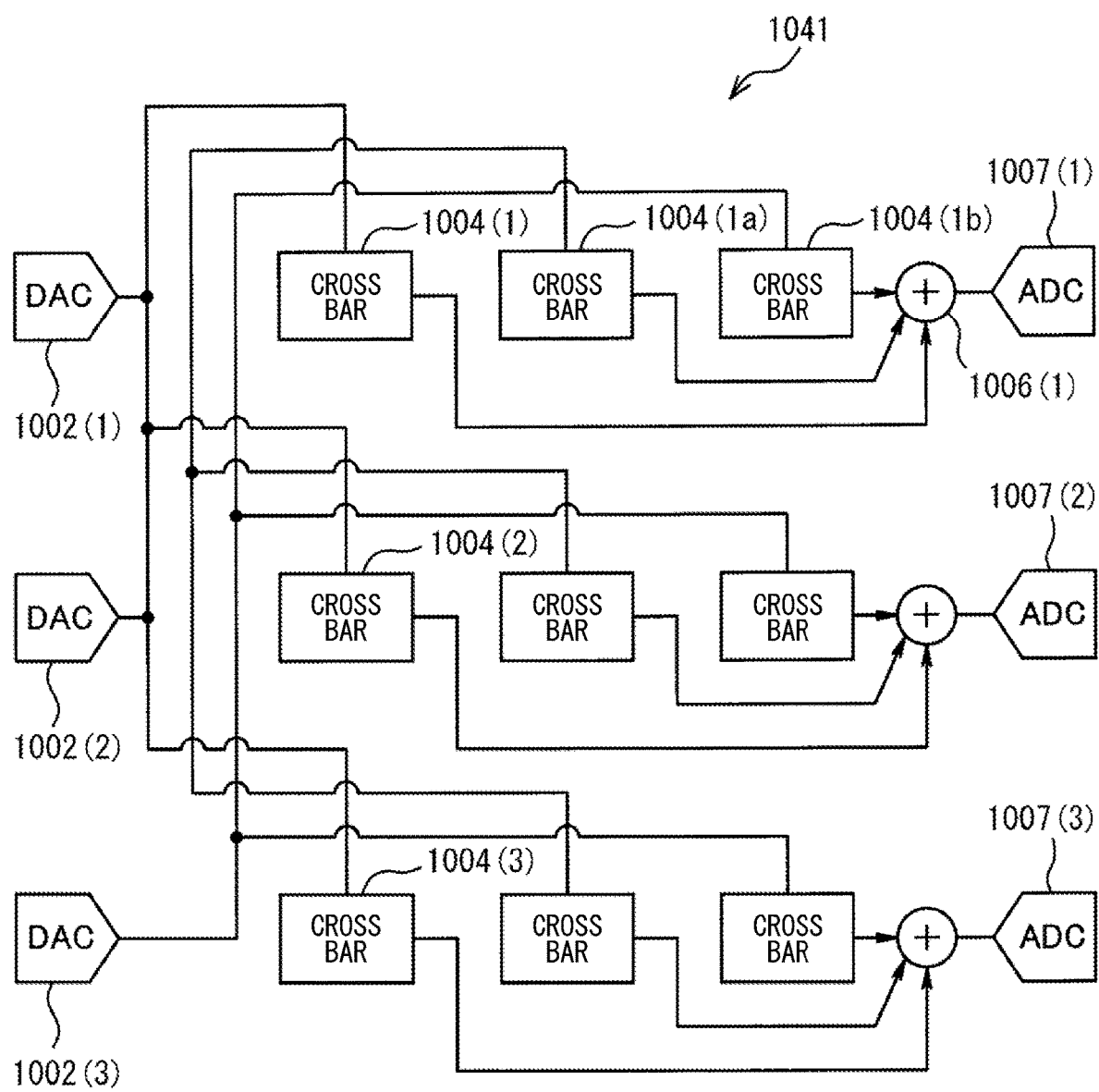
FIG. 25 is a functional block diagram schematically showing the analog product-sum calculation circuit including the multiple crossbars.

The seventh embodiment additionally includes the decoder 1024 (*a*) added in the built-in DAC portion 1013, and the drive amplifier 1014 (*a*) connected with the decoder 1024 (*a*), as shown in FIG. 23. It may be possible to increase the number of the output terminal of the built-in DAC portion 1013. In FIG. 25, for example, the number of output terminals of the D/A converter 1002 (1) is tripled and the voltages are applied in parallel to the crossbar circuits 1004 (1), 1004 (2) and 1004 (3).

Figure 24:
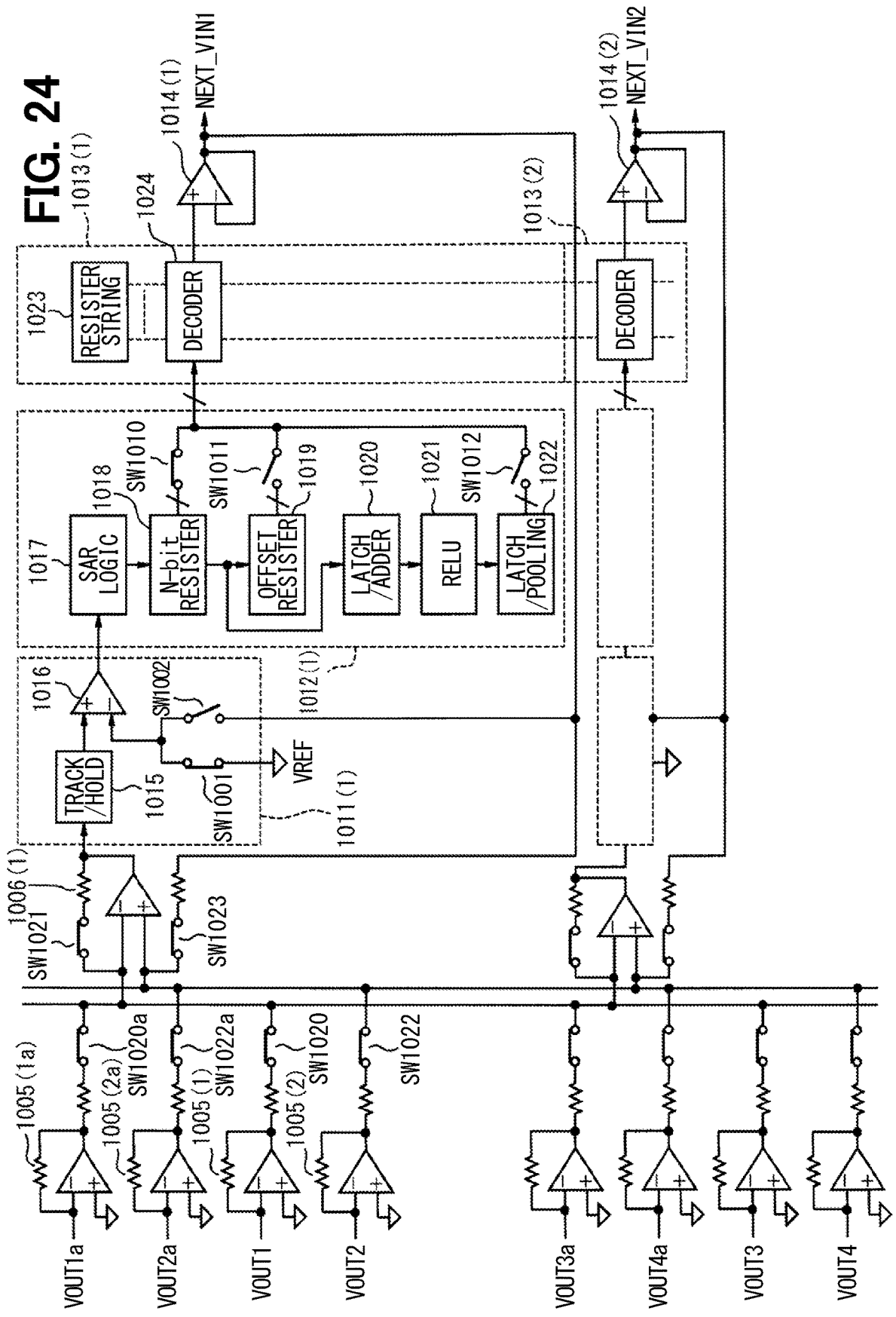
FIG. 24 is a diagram showing the differential amplifier and the A/D converter in an output side of the multiple crossbar circuits.

As shown in FIG. 24, the output terminal of each sense amplifier 1005 is connected with the input side of the differential amplifier 1006 via the resistance element. Therefore, the differential amplifier 1006 functions also as an analog addition circuit. Vout1 in the drawings corresponds to, for example, the output signal of the crossbar circuit 1004 (1) in FIG. 25. Vout1*a* corresponds to the output signal of the crossbar circuit 1004 (1*a*) in FIG. 25. These Vout are added in the input side of the differential amplifier 1006. The A/D converter 1007 (1) A/D-converts the addition result. Thereby, the analog product-sum calculation circuit 1041 is provided.

The output data of the A/D converters 1007 (1), 1007 (2), and 1007 (3) are D/A-converted by the built-in DAC portion 1013 similarly to the fifth and sixth embodiments. The converted data is input to the crossbar circuit 1004 of the analog product-sum calculation circuit 1041 in the next layer. The calculation result data in the analog product-sum calculation circuit 1041 in the final layer is added in the digital region.

In the seventh embodiment, the analog product-sum calculation circuit 1041 includes the multiple crossbar circuits 1004, performs the addition of the output signals from the multiple crossbar circuits 1004, functions the differential amplifier 1006 as an analog addition circuit, and inputs the addition result to the A/D converter 1007 to perform the A/D conversion. In the analog product-sum calculation circuit 1041 of the final layer, the data A/D-converted by the A/D converter 1007 is added in the digital region. Due to the combination of the analog signal addition and the digital signal addition, it may be possible to provide the calculation unit having the large scale while optimizing the calculation process time.

Eighth Embodiment

The activation function may be a function other than the ramp function.

According to another aspect of the present disclosure, a neural network circuit includes: at least one of storage portions that may include memristors connected in a lattice shape, each of the memristors being a variable resistance element; multiple D/A converters that may receive data to apply a signal voltage to multiple voltage input terminals of the storage portion; multiple drive amplifiers that may be connected between the multiple D/A converters and the multiple voltage input terminals; multiple I/V conversion amplifiers that may be connected with a current output terminal of the storage portion and are convert a current flowing in the current output terminal into a voltage to output the voltage; and multiple calculation units that may include multiple A/D converters that may A/D-convert the signal voltages converted by the multiple I/V conversion amplifiers.

The A/D converter may have a successive approximation type converter that may include a resistance string type D/A converter as a built-in D/A converter. The built-in D/A converter may switch so as to apply the signal voltage of a calculation result performed by the storage portion to the multiple drive amplifiers arranged corresponding to the storage portion of the calculation unit in a next layer. In the configuration, it may be possible to employ the built-in D/A converter built in the successive approximation type A/D converter in the previous layer, as the D/A converter for inputting the data to the calculation unit in the next layer between the consecutive calculation units. It may be possible to reduce the circuit scale for the configuration of employing the built-in D/A converter.

Further, according to another aspect of the present disclosure, the neural network circuit further may include: a differential amplifier that may perform a differential calculation to outputs of two I/V conversion amplifiers forming a pair; and an offset register that may store data that may be A/D-converted by the A/D converter. The A/D converter may A/D-convert an output voltage of the differential amplifier. An output terminal of the built-in D/A converter may switch to apply a reference voltage to the differential amplifier. The differential amplifier may output an offset voltage in a state where the signal voltage may be not applied to the voltage input terminal of the storage portion. The A/D converter may A/D-convert the offset voltage. In the configuration, it may be possible to perform the offset correction of the differential amplifier based on voltage data stored in an offset register.

The neural network circuit may include the multiple layers. Each of the multiple layers may include the storage portion, the calculation unit, or the like.

Although the present disclosure has been made in accordance with the embodiments, it is understood that the present disclosure is not limited to such embodiments and structures. The present disclosure covers various modification examples and equivalent arrangements. Furthermore, various combinations and formations, and other combinations and formations including one or more than one or less than one element may be included in the scope and the spirit of the present disclosure.

What is claimed is:

1. A neural network circuit comprising:
   a storage portion that includes memristors connected in a lattice shape, each of the memristors being a variable resistance element;
   a plurality of digital-to-analog (D/A) converters configured to receive data to apply a signal voltage and a reference voltage to a plurality of voltage input terminals of the storage portion;
   a plurality of drive amplifiers that are connected between the plurality of D/A converters and the plurality of voltage input terminals;
   a plurality of current-to-voltage (I/V) conversion amplifiers that
      are connected with a current output terminal of the storage portion, and are configured to convert a current flowing in the current output terminal into a voltage to output the voltage as a signal voltage;
a plurality of analog-to-digital (A/D) converters configured to A/D-convert the signal voltage converted by the plurality of I/V conversion amplifiers; and
a plurality of offset correctors that
are arranged in an output side of the plurality of A/D converters and
are configured to correct an offset voltage generated in the I/V conversion amplifiers, wherein:
one of the voltage input terminals is a bias terminal for applying a bias voltage;
at least one of the drive amplifiers that is connected with the bias terminal is a bias application amplifier configured to apply the bias voltage, but with an opposite polarity, and the reference voltage according to a voltage received from the corresponding D/A converter;
the offset corrector includes
a first latch circuit configured to receive output data of the A/D converter,
a second latch circuit configured to receive the output data of the A/D converter,
a subtractor configured to subtract latch data of the first latch circuit from latch data of the second latch circuit, and
a controller configured to control the D/A converters, the first latch circuit and the second latch circuit;
in performing a bias setting operation, the controller is further configured to control the bias application amplifier to output the bias voltage with the opposite polarity, control each of the D/A converters to cause the drive amplifier other than the bias application amplifier to output the reference voltage, and also cause the first latch circuit to latch the output data of the A/D converter;
in performing an operation other than the bias setting operation, the controller is further configured to control the bias application amplifier to output the reference voltage, control each of the D/A converters to cause the drive amplifier other than the bias application amplifier to output the signal voltage, and also cause the second latch circuit to latch the output data of the A/D converter; and
the controller is further configured to output a subtraction result of the subtractor as signal data.

2. The neural network circuit according to claim 1, wherein:
the controller is further configured to intermittently perform the bias setting operation.

3. The neural network circuit according to claim 2, wherein:
the controller includes a clock counter configured to count a clock signal; and
the controller is further configured to perform the bias setting operation each time when a count value of the clock counter reaches a predetermined value.

4. The neural network circuit according to claim 3, wherein:
when the count value reaches the predetermined value, the clock counter changes an output signal to an active level for one clock period;
the controller is further configured to control the D/A converter corresponding to the bias application amplifier based on the output signal of the clock counter; and
the controller is further configured to control a latch timing of the first latch circuit and a latch timing of the second latch circuit while controlling the D/A converter corresponding to the drive amplifier by inverting the output signal.

5. The neural network circuit according to claim 4, further comprising:
a buffer circuit that includes a control terminal configured to control an input data value, wherein:
the buffer circuit is configured to input data to cause the corresponding amplifier to output the reference voltage, according to a change in a binary level supplied to the control terminal.

6. The neural network circuit according to claim 2, wherein:
the controller includes a temperature sensor; and
the controller is further configured to perform the bias setting operation when a variation level of a temperature detected by the temperature sensor exceeds a predetermined level.

7. The neural network circuit according to claim 6, wherein:
the temperature sensor includes a reset terminal configured to change an output signal to an active level when the variation level of the temperature exceeds the predetermined level, and change the output signal to an inactive level after changing to the active level;
the controller includes a digital (D) flip flop that includes a clock terminal configured to receive the clock signal;
an output terminal of the temperature sensor is connected with an input terminal of the D flip flop;
the reset terminal is connected with an inversion output terminal of the D flip flop;
the controller is further configured to control the D/A converter corresponding to the bias application amplifier by an output signal of the D flip flop; and
the controller is further configured to control a latch timing of the first latch circuit and a latch timing of the second latch circuit while controlling the D/A converter corresponding to the drive amplifier by inverting the output signal of the temperature sensor.

8. A neural network circuit comprising:
a storage portion that includes memristors connected in a lattice shape, each of the memristors being a variable resistance element;
a plurality of digital-to-analog (D/A) converters configured to receive data to apply a signal voltage and a reference voltage to a plurality of voltage input terminals of the storage portion;
a plurality of drive amplifiers that are connected between the plurality of D/A converters and the plurality of voltage input terminals;
a plurality of current-to-voltage (I/V) conversion amplifiers that are connected with a current output terminal of the storage portion, and are configured to convert a current flowing in the current output terminal into a voltage to output the voltage;
a differential amplifier configured to perform a differential calculation to outputs of two I/V conversion amplifiers forming a pair to generate an output voltage;
a plurality of analog-to-digital (A/D) converters configured to A/D convert the output voltage of the differential amplifier; and
a plurality of offset correctors that
are arranged in an output side of the plurality of A/D converters and
are configured to correct an offset voltage generated in the I/V conversion amplifiers, wherein:
one of the voltage input terminals is a bias terminal configured to apply a bias voltage;
at least one of the drive amplifiers that is connected with the bias terminal is a bias application amplifier configured to apply the bias voltage and a reference voltage according to a voltage received from the corresponding D/A converter;
conductance values of a differential pair of the memristors in the storage portion that apply the bias voltage are set in advance to reverse a polarity of the bias voltage;
the offset corrector includes
a first latch circuit configured to receive output data of the A/D converter,
a second latch circuit configured to receive the output data of the A/D converter,
a subtractor configured to subtract latch data of the first latch circuit from latch data of the second latch circuit, and
a controller configured to control the D/A converters, the first latch circuit and the second latch circuit;
in performing a bias setting operation, the controller is further configured to control the bias application amplifier to output the bias voltage, and control each of the D/A converters to cause the drive amplifier other than the bias application amplifier to output the reference voltage, and cause the first latch circuit to latch the output data of the A/D converter; and
in performing a an operation other than the bias setting operation, the controller is further configured to control the bias application amplifier to output the reference voltage, and control each of the D/A converters to cause the drive amplifier other than the bias application amplifier to output the signal voltage, and cause the second latch circuit to latch the output data of the A/D converter, and output a subtraction result of the subtractor as signal data.

9. The neural network circuit according to claim 8, wherein:
the controller is further configured to intermittently perform the bias setting operation.

10. The neural network circuit according to claim 9, wherein:
the controller includes a clock counter configured to count a clock signal; and
the controller is further configured to perform the bias setting operation each time when a count value of the clock counter reaches a predetermined value.

11. The neural network circuit according to claim 10, wherein:
when the count value reaches the predetermined value, the clock counter changes an output signal to an active level for one clock period;
the controller is further configured to control the D/A converter corresponding to the bias application amplifier based on the output signal of the clock counter; and
the controller is further configured to control a latch timing of the first latch circuit and a latch timing of the second latch circuit while controlling the D/A converter corresponding to the drive amplifier by inverting the output signal.

12. The neural network circuit according to claim 11, further comprising:
a buffer circuit that includes a control terminal configured to control an input data value, wherein:
the buffer circuit is configured to input data to cause the corresponding amplifier to output the reference voltage, according to a change in a binary level supplied to the control terminal.

13. The neural network circuit according to claim 9, wherein:
the controller includes a temperature sensor; and
the controller is further configured to perform the bias setting operation when a variation level of a temperature detected by the temperature sensor exceeds a predetermined level.

14. The neural network circuit according to claim 10, wherein:
the temperature sensor includes a reset terminal configured to change an output signal to an active level when the variation level of the temperature exceeds the predetermined level, and change the output signal to an inactive level after changing to the active level;
the controller includes a digital (D) flip flop that includes a clock terminal configured to receive the clock signal;
an output terminal of the temperature sensor is connected with an input terminal of the D flip flop;
the reset terminal is connected with an inversion output terminal of the D flip flop;
the controller is further configured to control the D/A converter corresponding to the bias application amplifier by an output signal of the D flip flop; and
the controller is further configured to control a latch timing of the first latch circuit and a latch timing of the second latch circuit while controlling the D/A converter corresponding to the drive amplifier by inverting the output signal of the temperature sensor.

15. A neural network circuit comprising:
at least one storage portion of a plurality of storage portions, the at least one storage portion including memristors connected in a lattice shape, each of the memristors being a variable resistance element;
a plurality of digital-to-analog (D/A) converters that receive data to apply a signal voltage to a plurality of voltage input terminals of the at least one storage portion;
a plurality of drive amplifiers that are connected between the plurality of D/A converters and the plurality of voltage input terminals;
a plurality of current-to-voltage (I/V) conversion amplifiers that
are connected with a current output terminal of the at least one storage portion and
are configured to convert a current flowing in the current output terminal into a voltage to output the voltage; and
a plurality of calculation units that include a plurality of analog-to-digital (A/D) converters configured to A/D-convert the signal voltages converted by the plurality of I/V conversion amplifiers, wherein:
the A/D converter has a successive approximation type converter that includes a resistance string type D/A converter as a built-in D/A converter; and
the built-in D/A converter is configured to switch so as to apply the signal voltage of a calculation result performed by the at least one storage portion to the plurality of drive amplifiers arranged corresponding to the at least one storage portion of the calculation unit in a next layer.

16. The neural network circuit according to claim 15, further comprising:

a differential amplifier configured to perform a differential calculation to outputs of two I/V conversion amplifiers forming a pair; and an offset register configured to store data that is A/D-converted by the A/D converter, wherein:

the A/D converter is configured to A/D-convert an output voltage of the differential amplifier;

the built-in D/A converter includes an output terminal that is configured to switch to apply a reference voltage to the differential amplifier; and the offset register stores the data that is obtained by A/D conversion of the offset voltage which is outputted by the differential amplifier in a state where the signal voltage is not applied to the voltage input terminal of the at least one storage portion, the A/D conversion of the offset voltage being performed by the A/D converter.

17. The neural network circuit according to claim 15, wherein:

the calculation unit includes the plurality of storage portions; and the calculation unit is configured to select one of the plurality of storage portions as a selected storage portion, cause the D/A converter positioned in an input side to apply the signal voltage to the selected storage portion, cause the A/D converter to A/D-convert the output signal voltage, and accumulate a calculation result of each of the plurality of storage portions in an output side of the A/D converter.

18. The neural network circuit according to claim 15, wherein:

the calculation unit includes the plurality of storage portions;

the calculation unit includes an adder that includes an analog circuit between the plurality of storage portions and the plurality of D/A converters; and the A/D converter is configured to A/D-convert an addition result by the adder.

19. The neural network circuit according to claim 18, wherein:

the calculation results of the calculation units are accumulated in an output side of the A/D converter.

* * * * *